United States Patent
Etoh et al.

(10) Patent No.: US 7,345,268 B2
(45) Date of Patent: Mar. 18, 2008

(54) BACK-ILLUMINATED IMAGE DEVICE HAVING SIGNAL CHARGES SUPPRESSING REGION

(75) Inventors: Takeharu Etoh, 21-2, Aomatanihigashi 7-chome, Mino-shi, Osaka 562-0022 (JP); Hideki Muto, Odawara (JP)

(73) Assignees: Shimadzu Corporation, Kyoto-shi (JP); Takeharu Etoh, Mino-shi (JP)

( * ) Notice: Subject to any disclaimer, the term of this patent is extended or adjusted under 35 U.S.C. 154(b) by 122 days.

(21) Appl. No.: 10/541,411

(22) PCT Filed: Dec. 26, 2003

(86) PCT No.: PCT/JP03/16862

§ 371 (c)(1),
(2), (4) Date: Apr. 24, 2006

(87) PCT Pub. No.: WO2004/061965

PCT Pub. Date: Jul. 22, 2004

(65) Prior Publication Data

US 2006/0255240 A1    Nov. 16, 2006

(30) Foreign Application Priority Data

Jan. 6, 2003    (JP)    ............................ 2003-000117

(51) Int. Cl.
*H01L 27/00* (2006.01)
(52) U.S. Cl. .................. 250/208.1; 250/214 R
(58) Field of Classification Search ............ 250/208.1, 250/214 R, 214.1, 239, 216; 257/291–293, 257/440, 80–85; 348/294, 302, 314, 299
See application file for complete search history.

(56) References Cited

U.S. PATENT DOCUMENTS 5,907,767 A    5/1999    Tohyama (Continued)

FOREIGN PATENT DOCUMENTS

EP    1 278 246 A1    1/2003

(Continued)

OTHER PUBLICATIONS

"A CCD Image Sensor of 1M frames/s for Continuous Image Capturing of 103 Frames" Digest of Technical Papers, 2002 IEEE International Solid-State Circuits Conference, 2002, vol. 45, p. 46 to 47; and Takeharu ETOH and four others.

(Continued)

*Primary Examiner*—Que T Le
(74) *Attorney, Agent, or Firm*—Birch, Stewart, Kolasch & Birch, LLP

(57) ABSTRACT

A back-illuminated image sensor has a converting layer 21, charge collecting portions 24, and suppressing regions 23 and 29. The converting layer 21 for converting an incident beam into signal charges is formed on one side of an incident face 8 on which an incident beam is irradiated. The converting layer 21 is provided for each of pixels arranged in two dimensions. The charge collecting portions 24 for collecting signal charges generated in the converting layer 21 extends from the converting layer 21 to a surface 22 opposite to the incident face 8. The suppressing regions 23 and 29 for suppressing the flow of the signal charges from the converting layer 21 to peripheral circuits 26 is formed between the converting layer 21 and the peripheral circuits 26.

8 Claims, 20 Drawing Sheets

U.S. PATENT DOCUMENTS

| | | | |
|---|---|---|---|
| 6,665,374 B2 * | 12/2003 | Izumi et al. | 379/40 |
| 2002/0060741 A1 | 5/2002 | Kusaka | |
| 2003/0089908 A1 | 5/2003 | Mutoh et al. | |

FOREIGN PATENT DOCUMENTS

| | | |
|---|---|---|
| JP | 59-108465 A | 6/1984 |
| JP | 9-82932 A | 3/1997 |
| JP | 9-331052 A | 12/1997 |
| JP | 2000-324400 A | 11/2000 |
| JP | 2001-210812 A | 8/2001 |
| JP | 2001-345441 A | 12/2001 |
| JP | 2002-135659 A | 5/2002 |
| KR | 97-18448 A | 4/1997 |
| WO | WO-01/73849 A1 | 10/2001 |

OTHER PUBLICATIONS

"An In-situ Storage Image Sensor of 1M frames/s with Slanted Linear CCD Storage" Journal of the Institute of Image Information and Television Engineers, the Institute of Image Information and Television Engineers, 2002, vol. 56, No. 3, pp. 483 to 486.

* cited by examiner

BACK-ILLUMINATED IMAGE DEVICE HAVING SIGNAL CHARGES SUPPRESSING REGION

TECHNICAL FIELD

The present invention relates to a back-illuminated image sensor. More particularly, the present invention relates to a back-illuminated image sensor suited for photographing being-used for measurements in the fields of science and technology.

BACKGROUND ART

A back-illuminated image sensor is known wherein an incident beam, such as visible light, is irradiated to one face of a chip (back face) opposite to the other face (surface) of the chip on which electrodes and the like are disposed (see Japanese Patent Application Laid-Open Publication No. H9-331052, for example). The back-illuminated image sensor is provided with a converting portion for each pixel (a photoelectric converting portion in the case that the incident beam is visible light) on the back face side of the chip, and it is provided with portions for processing signal charges (charge processing portions) in some way, such as an A/D converter and a signal storage portion on the surface side of the chip.

Since the back-illuminated image sensor can achieve a high aperture ratio of nearly 100%, it can realize very high sensitivity. For this reason, the back-illuminated image sensor is frequently used in applications requiring high sensitivity such as fields of astronomy and electronic microscopy. Furthermore, due to its high sensitivity, the back-illuminated image sensor is also suited for high-speed image capturing wherein exposure time for each one of images is short.

Mixture of signal charges into the charge processing portions is the major problem in the back-illuminated image sensor. More specifically, signal charges, such as photoelectrons, generated in the converting portion, are mixed by diffusion or diffraction in some parts of the charge processing portion into which the signal charges should not be mixed intrinsically. The mixed signal charges hamper the function of the charge processing portion.

Transmission of light is another problem in the back-illuminated image sensor. The chip of the back-illuminated image sensor is required to be made as thin as possible. If the chip is thick, before the charges generated corresponding to the incident beam reach the function region, the charges in the adjacent pixels are mixed mutually, and noise owing to crystal defects inside the chip is mixed into the signal charges. Since the chip is thin as described above, light having long wavelengths and high transmittance (low absorption coefficient) reaches the function region on the side of the surface, resulting in that undesirable and unnecessary charges are generated inside the function region. These charges also hamper the functions of the elements provided in the function region.

The present inventors have developed an in-situ storage image sensor (ISIS) provided with linear signal storage portions inside or in the vicinity of pixels. For example, the following documents have been issued. Japanese Patent Application Laid-Open Publication No. 2001-345441; Takeharu ETOH et al: "A CCD Image Sensor of 1M frames/s for Continuous Image Capturing of 103 Frames," Digest of Technical Papers, 2002 IEEE International Solid-State Circuits Conference, 2002, Vol. 45, p. 46 to 47; and Takeharu ETOH and four others: "An In-situ Storage Image Sensor of 1M frames/s with Slanted Linear CCD Storage," Journal of the Institute of Image Information and Television Engineers, the Institute of Image Information and Television Engineers, 2002, Vol. 56, No. 3, p. 483 to 486. In the case that a back-illuminated structure is adopted for the in-situ storage image sensor, the above-mentioned problems owing to the mixture of signal charges and the transmission of light become particularly significant.

SUMMARY OF THE INVENTION

The object of the present invention is to prevent mixture of signal charges in a back-illuminated image sensor and generation of unnecessary charges due to light transmission in the back-illuminated image sensor.

In this specification, the term "incident beam" refers to a flow of energy or particles irradiated to an image sensor and detected by the image sensor. The incident beam includes electromagnetic rays including light rays, such as ultraviolet rays, visible rays, and infrared rays, the flow of charged particles, such as electrons, ions, and holes, and radioactive rays including $\alpha$-rays, $\gamma$-rays, $\beta$-rays and neutron rays in addition to X-rays, The present invention provides a back-illuminated image sensor, comprising a converting portion for converting an incident beam into signal charges, the converting portion being provided on an incident face side on which the incident beam is irradiated, and the converting portion being provided for each of a plurality of pixels arranged in two dimensions; a charge collecting portion for collecting the signal charges generated in the converting portion, the charge collecting portion extending from the converting portion to a surface side opposite to the incident face side; a charge processing portion for processing the signal charges collected by the charge correcting portions, the charge processing portion being provided on the surface side; and a suppressing region for suppressing a flow of the signal charges from the converting portion into the charge processing portion, the suppressing region being arranged between the converting portion and the charge processing portion.

The suppressing region provided between the converting portion and the charge processing portions prevents the phenomenon wherein the signal charges generated in the converting portion flow not into the charge collecting portions but directly into the charge processing portions due to diffusion or diffraction. Thus, noise generation or the like due to the mixture of the signal charges into the charge processing portions can be prevented.

More specifically, the converting portion, charge collecting portion, charge processing portion, and suppressing region are made of semiconductor materials. The converting portion has a first conductivity type. The charge collecting portion has a second conductivity type. The suppressing region comprises a charge blocking layer having the first conductivity type. A conductivity impurity concentration of the charge blocking layer is higher than that of the converting portion. The charge processing portions is embedded in the charge blocking layer and penetrates through the charge blocking layer.

In the case that the signal charges are electrons, the first conductivity type is the p-type, and the second conductivity type is the n-type. In the case that the signal charges are holes, the first conductivity type is the n-type, and the second conductivity type is the p-type.

Preferably, the suppressing region further comprises a charge collecting layer having the second conductivity type, disposed between the converting portion and the charge blocking layer, and connected to an end portion at the incident face side of the charge collecting portion.

The charges having generated in the converting portion gather once in the charge collecting layer. The signal charges having gathered in the charge collecting layer move in the horizontal direction and are collected in the charge collecting portions. Thus, the mixture of the signal charges into the charge processing portions can be blocked more effectively by providing the charge collecting layer.

The function and structure of the charge processing portion is not limited particularly. The charge processing portion is, for example, an A/D converter for converting analog signals into digital signals.

The present invention is also applicable to an in-situ storage image sensor. In other words, the charge processing portion may be a signal charge storage portion for storing the signal charges provided inside or in the vicinity of each pixel. The image sensor has high sensitivity, a feature of the back-illuminated type, and also has very high image-capturing speed, a feature of the in-situ storage type. Further, noise generation owing to the mixture of signal charges into the signal charge storage portion can be prevented.

In the case that the incident beam is light, the image sensor further may comprise an optical filter for blocking light having such wavelengths as that the light is transmitted from the incident side into the charge processing portion to cause generation of charges similar to the signal charges in the charge processing portion. It is thus possible to prevent the phenomenon wherein the light directly reaches the signal storage portions. This prevents deterioration in image quality caused by generation of unnecessary generation of charges.

Furthermore, the present invention provides an electron microscope and an image capturing apparatus each provided with the back-illuminated image sensor.

According to the back-illuminated image sensor of the present invention, the suppressing region arranged between the converting portion and the charge processing portions prevents the phenomenon wherein the signal charges generated in the converting portion flow not into the charge collecting portions but directly into the charge processing portions by diffusion or diffraction. Therefore, noise generation or the like due to the mixture of the signal charges into the charge collecting portions can be prevented.

BRIEF DESCRIPTION OF THE DRAWINGS

The above and other objects and features of the invention will become apparent from the following description of preferred embodiments of the invention with reference to the accompanying drawings.

DETAILED DESCRIPTION OF THE PREFERRED EMBODIMENTS

First Embodiment

Figure 1:
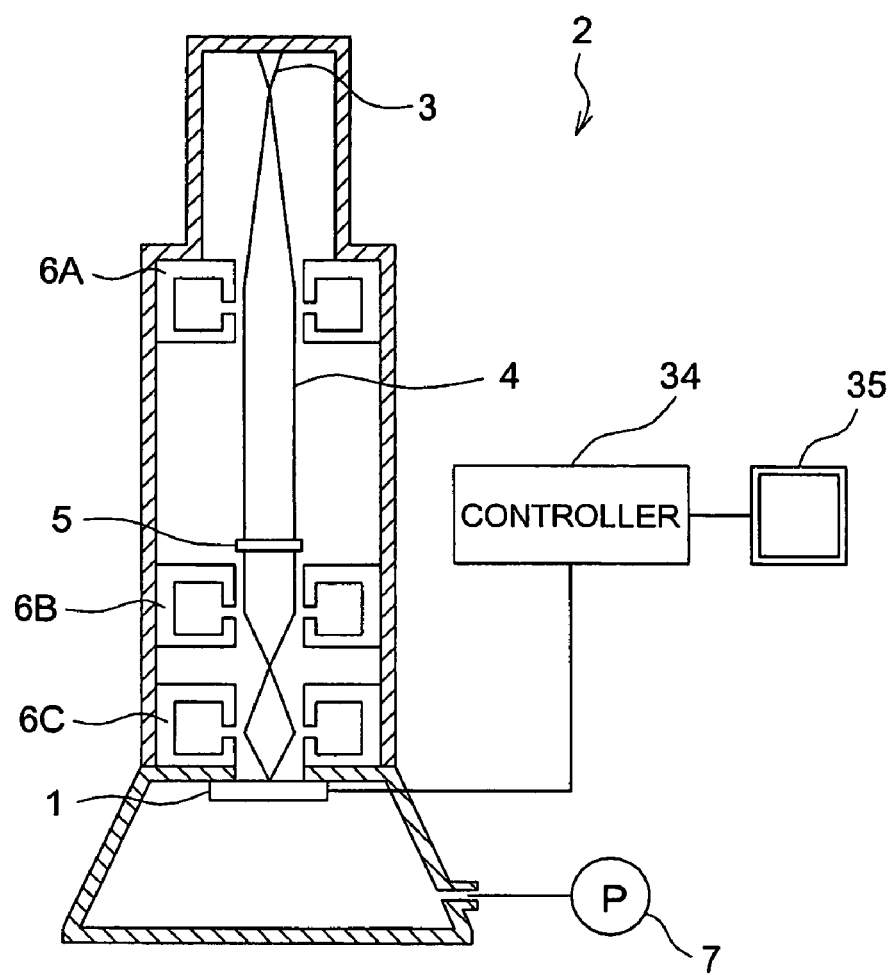
FIG. 1 is a schematic view showing a transmission electron microscope provided with a back-illuminated image sensor according to a first embodiment of the present invention.

FIG. 1 shows a transmission electron microscope 2 provided with a back-illuminated image sensor 1 according to a first embodiment of the present invention. In the transmission electron microscope 2, an electron current 4 (incident beam) is irradiated from an electron gun 3 to a sample 5, and the electron current 4 having passed through the sample 5 is focused on the back-illuminated image sensor 1. Reference numerals 6A to 6C denote magnetic lenses. The inside of the transmission electron microscope 2 accommodating the electron gun 3, sample 5, back-illuminated image sensor 1, and the magnetic lenses 6A to 6C is maintained at a required degree of vacuum by a vacuum pump 7.

Figure 2:
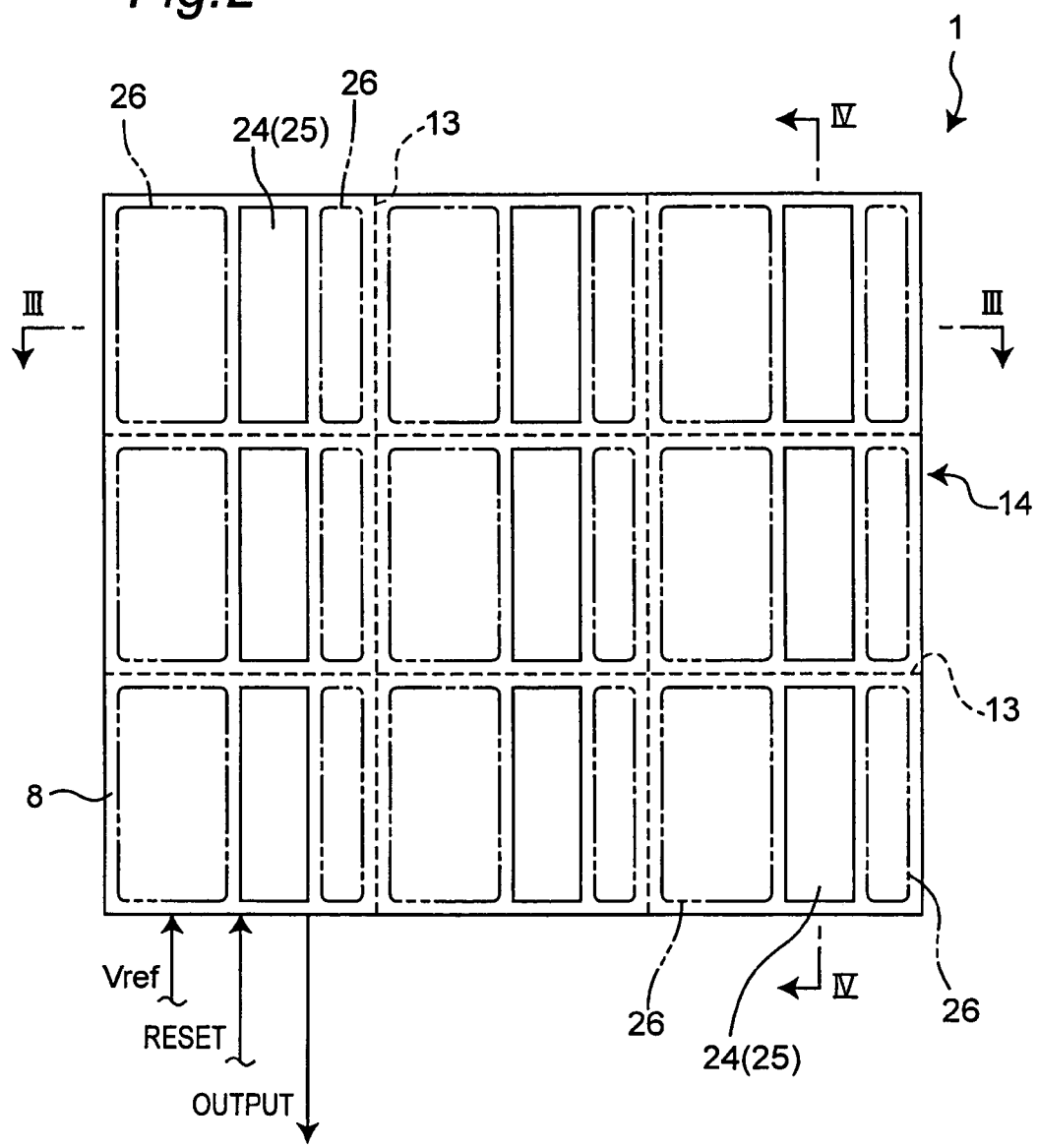
FIG. 2 is a schematic front view showing the back-illuminated image sensor according to the first embodiment of the present invention.
Figure 3:
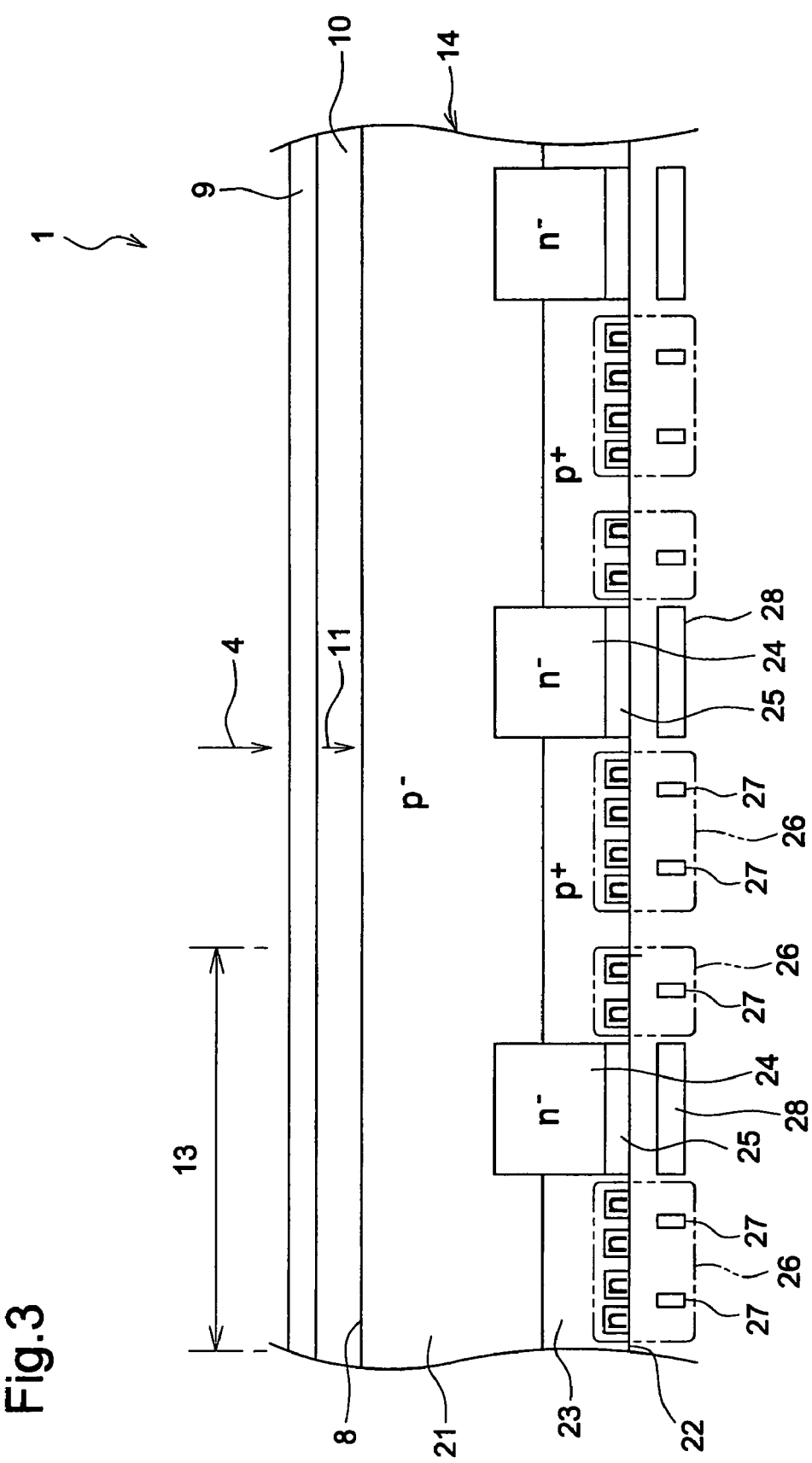
FIG. 3 is a cross-sectional view taken along a line III-III of FIG. 2.
Figure 4:
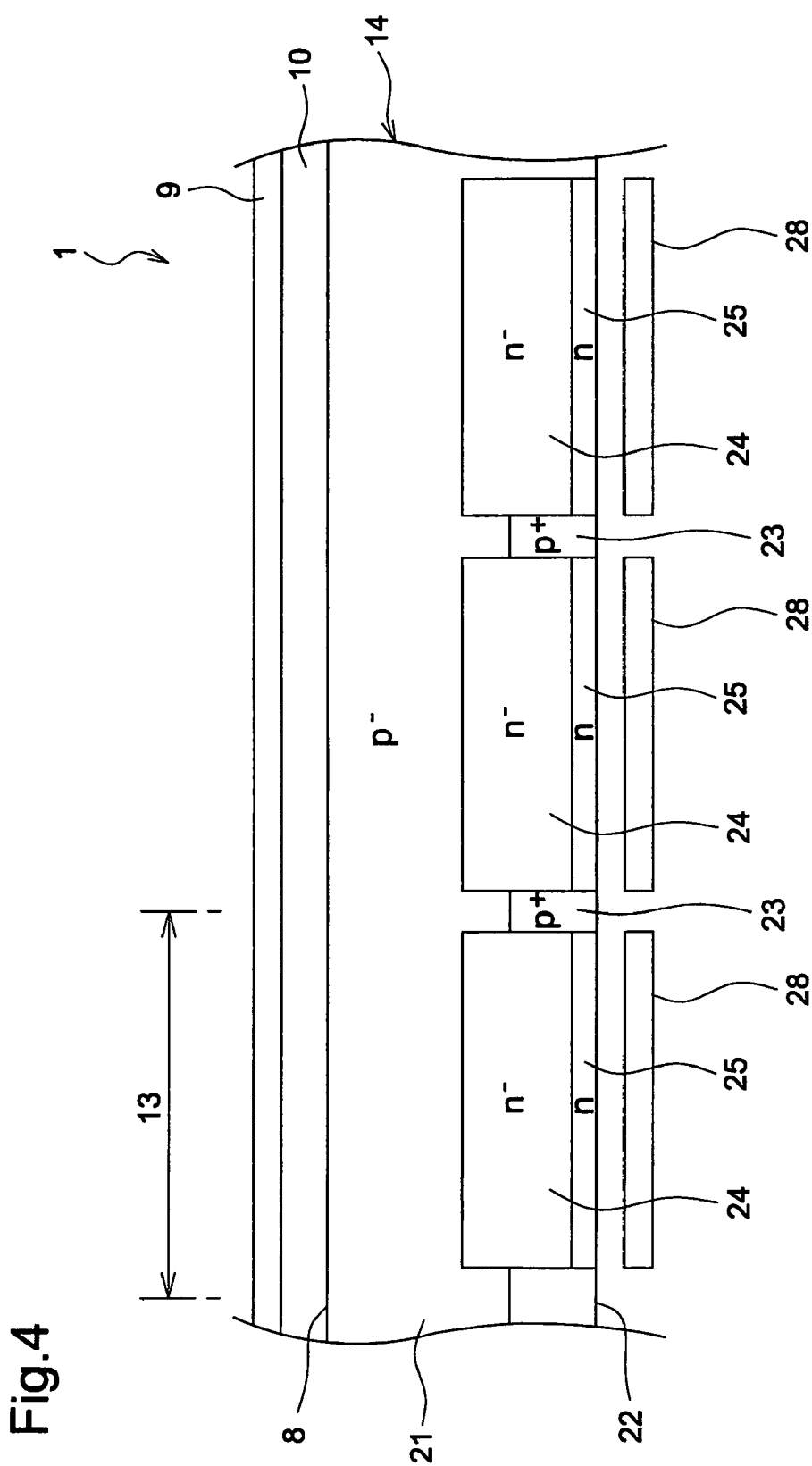
FIG. 4 is a cross-sectional view taken along a line IV-IV of FIG. 2.

With further reference to FIGS. 2 to 4, disposed on the side of the back face or the incident face 8 of the back-illuminated image sensor 1 is a fluorescent film 9 on which the electron current 4 having passed through the sample 5 is irradiated is. The fluorescent film 9 is optically connected to the incident face 8 by a fiberglass 10. The fluorescent film 9 emits light at a luminance corresponding to the intensity of the incident electron current 4, and the light 11 emitted from the fluorescent film 9 is irradiated on the incident face 8.

As shown in FIG. 2, a plurality of pixels 13 is arranged in two dimensions on the incident face 8 of the back-illuminated image sensor 1. Although only nine (three rows x three columns) pixels 13 are shown in FIG. 2 for simplicity, each of the number of the rows and the number of the columns of the pixels 13 can be not smaller than two.

As shown in FIGS. 3 and 4, a $p^-$-type converting layer 21 is provided on the side of the incident face 8 of a chip 14. Further, a $p^+$-type charge blocking layer 23 is provided nearer portion to the surface 22 of the chip 14 than the converting layer 21.

An $n^-$-type charge collecting portion 24 for collecting the signal charges generated in the converting layer 21 is provided for each of pixels 13. One end of the charge collecting portion 24 is located inside the converting layer 21. The charge collecting portion 24 extends from the converting layer 21 to the side of the surface 22 of the chip 14. An n-type input region 25 is provided at the other end of the charge collecting portion 24 located on the side of the surface 22 of the chip 14. The charge collecting portion 24 penetrates the charge blocking layer 23 with the input region 25 being embedded in the charge blocking layer 23.

Figure 5:
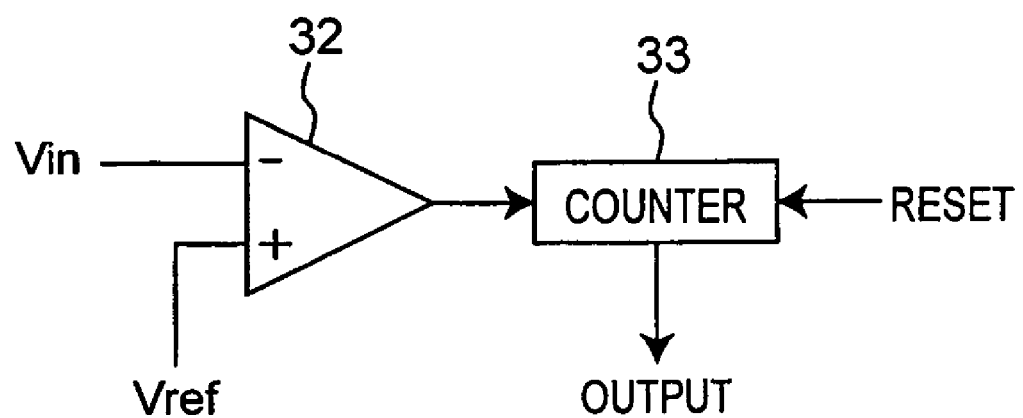
FIG. 5 is a schematic view showing an A/D converter of the back-illuminated image sensor according to the first embodiment.

Various peripheral circuits 26 (charge processing portions) including an A/D converter are provided for each pixel in the region on the surface 22 side of the charge blocking layer 23. These peripheral circuits 26 are embedded in the charge blocking layer 23. In FIGS. 3 and 4, a reference numeral 27 denotes the electrodes of the peripheral circuit 26, a reference numeral 28 denotes an electrode through which signal charges are transferred from the input region 25 to the peripheral circuit 26. As schematically shown in FIG. 5, a serial A/D converter 31 in the peripheral circuit 26 is provided with a comparator 32 and counter 33. Voltages $V_{in}$, i.e. signal charges, are input from the input region 25 to the comparator 32, and voltages $V_{ref}$ for reference are also input to the comparator 32. Outputs of the comparator 32 are transferred to the counter 33. The outputs of the counter 33 are transferred to a controller 34 as image signals (see FIG. 1). The controller 34 has various elements, such as a memory and an image processing circuit, and outputs captured images 34 to a display apparatus 35. Although the A/D converter 31 is provided for each of the pixels 13 as described above, a reset signals and the reference voltages $V_{ref}$ output from the controller 34 are common to all the pixels 13.

For example, the converting layer 21, charge blocking layer 23, charge collecting portion 24, and input region 25 of the back-illuminated image sensor 1 are made of semiconductor materials mainly consisting of $p^-$-type silicon having an impurity concentration of $1\times10^{10}$ to $1\times10^{15}$ cm$^{-3}$, $p^+$-type silicon having an impurity concentration of $1\times10^{15}$ to $1\times10^{16}$ cm$^{-3}$, n-type silicon having an impurity concentration of $1\times10^{13}$ to $1\times10^{16}$ cm$^{-3}$, and $n^+$-type silicon having an impurity concentration of $1\times10^{16}$ to $1\times10^{20}$ cm$^{-3}$ respectively. In this case, these can be produced by implanting boron and phosphorus ions on a $p^-$-type substrate using a photoresist as a mask and subsequent thermal diffusion.

When the electron current 4 having passed through the sample 5 enters the fluorescent film 9, the fluorescent film 9 emits light. The light 11 emitted by the fluorescent film 9 enters the back-illuminated image sensor 1 via the fiberglass 10. The light 11 having entered the incident face 8 reaches the converting layer 21 and generates electron-hole pairs.

Since the electrons have a negative charge, they gather at the $n^-$-type charge collecting portion 24 and further accumulate at the n-type input region 25. The holes pass through the $p^-$-type converting layer 21 and are ejected continuously to the outside of the chip. The electrons accumulating in the input region 25, i.e., signal charges, are output to the peripheral circuit 26 and subjected to various processes including the conversion from analog signals to digital signals by the A/D converter 31 and then output as image signals to the controller 34.

The $p^-$-type converting layer 21 and peripheral circuit 26 are separated from each other by the $p^+$-type charge blocking layer 23. Thus, it is possible to prevent the phenomenon wherein the electrons generated in the converting layer 21 directly reach the peripheral circuit 26 by diffusion or diffraction without passing through the charge collecting portion 24 and input region 25. For this reason, noise generation or the like in the peripheral circuit 26 due to the mixture of signal charges can be prevented. The charge blocking layer 23 also has a function of electrically separating the adjacent peripheral circuits 26 from each other.

Second Embodiment

Figure 6:
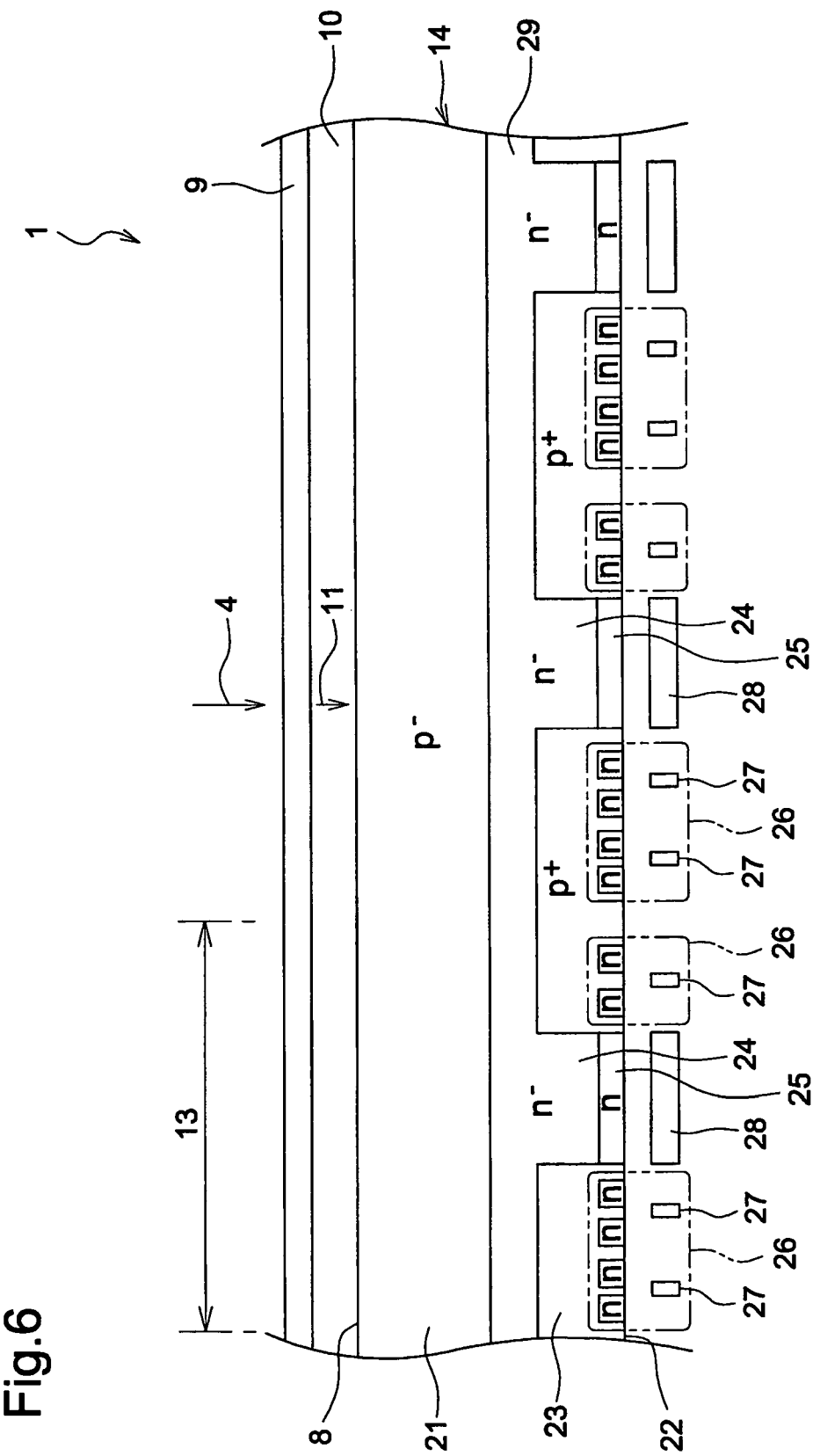
FIG. 6 is a cross-sectional view taken along a line III-III of FIG. 2, showing a back-illuminated image sensor according to a second embodiment of the present invention.
Figure 7:
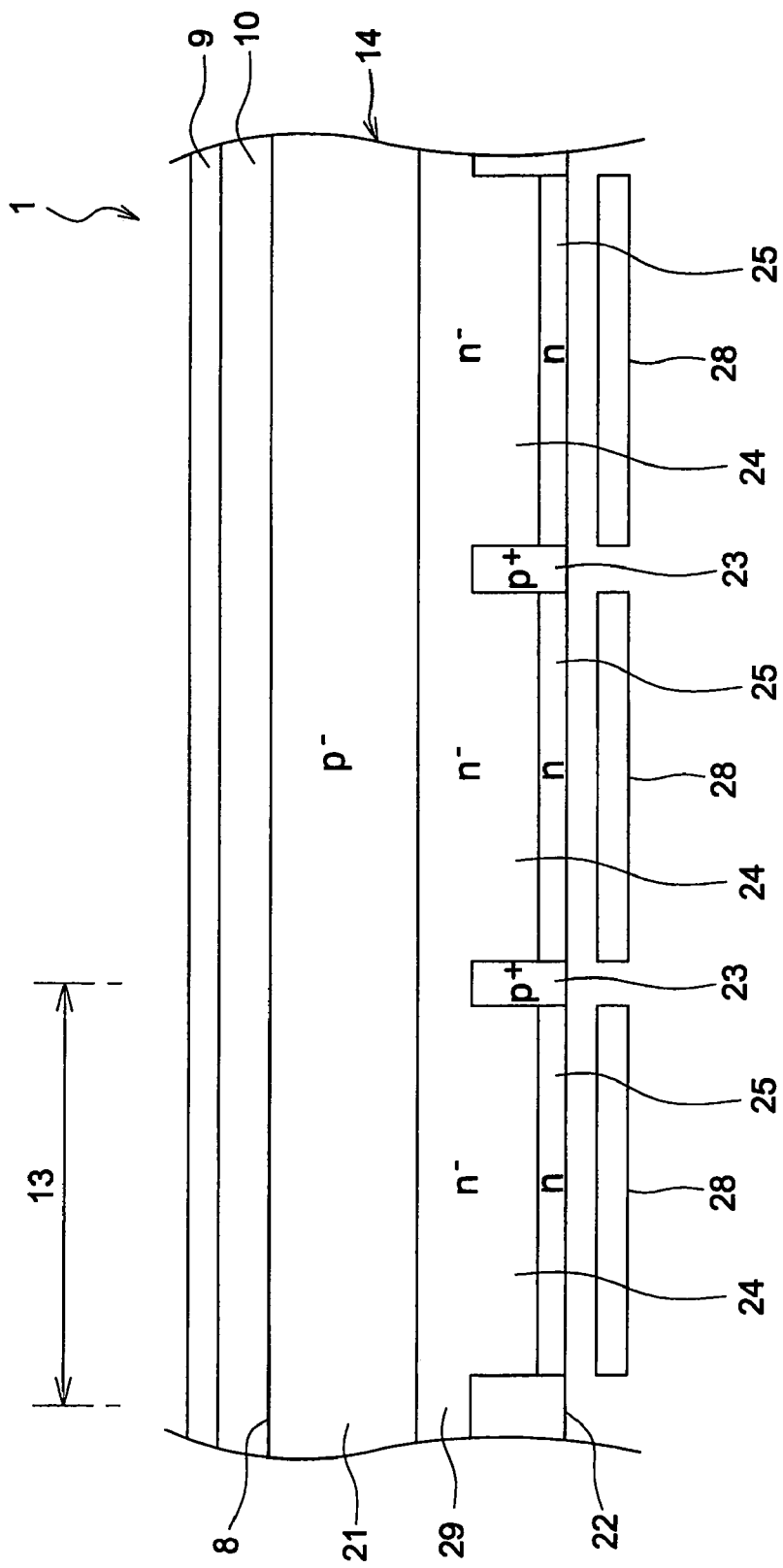
FIG. 7 is a cross-sectional view taken along a line IV-IV of FIG. 2, showing the back-illuminated image sensor according to the second embodiment of the present invention.

As shown in FIGS. 6 and 7, a back-illuminated image sensor 1 according to a second embodiment of the present invention is provided with an $n^-$-type charge collecting layer 29. The charge collecting layer 29 is arranged between the converting layer 21 and charge blocking layer 23 and is connected to one ends at the side of the incident face 8 of the charge collecting portions 24. The charges having generated in the converting layer 21 gather once in the charge collecting layer 29. The charges having gathered in the charge collecting layer 29 move in the horizontal direction and are collected in the charge collecting portions 24. Thus, provision of the charge collecting layer 29 prevents the mixture of the signal charges into the peripheral circuits 26 more effectively.

For example, the back-illuminated image sensor 1 according to the second embodiment is produced as follows. An $n^-$-layer having a thickness of approximately 2 to 8 μm is formed by implanting high-energy ions or by thermal diffusion to a surface side of a $p^-$-type substrate. Then, a $p^+$-layer is formed at approximately 2 to 8 μm from the surface in a similar way. Subsequently, the peripheral circuits 26 are formed on the surface side of the substrate by ion implantation.

Since the other configurations and operations of the second embodiment are similar to those of the first embodiment, the same elements are designated by the same numerals and their descriptions are omitted.

Third Embodiment

Figure 8:
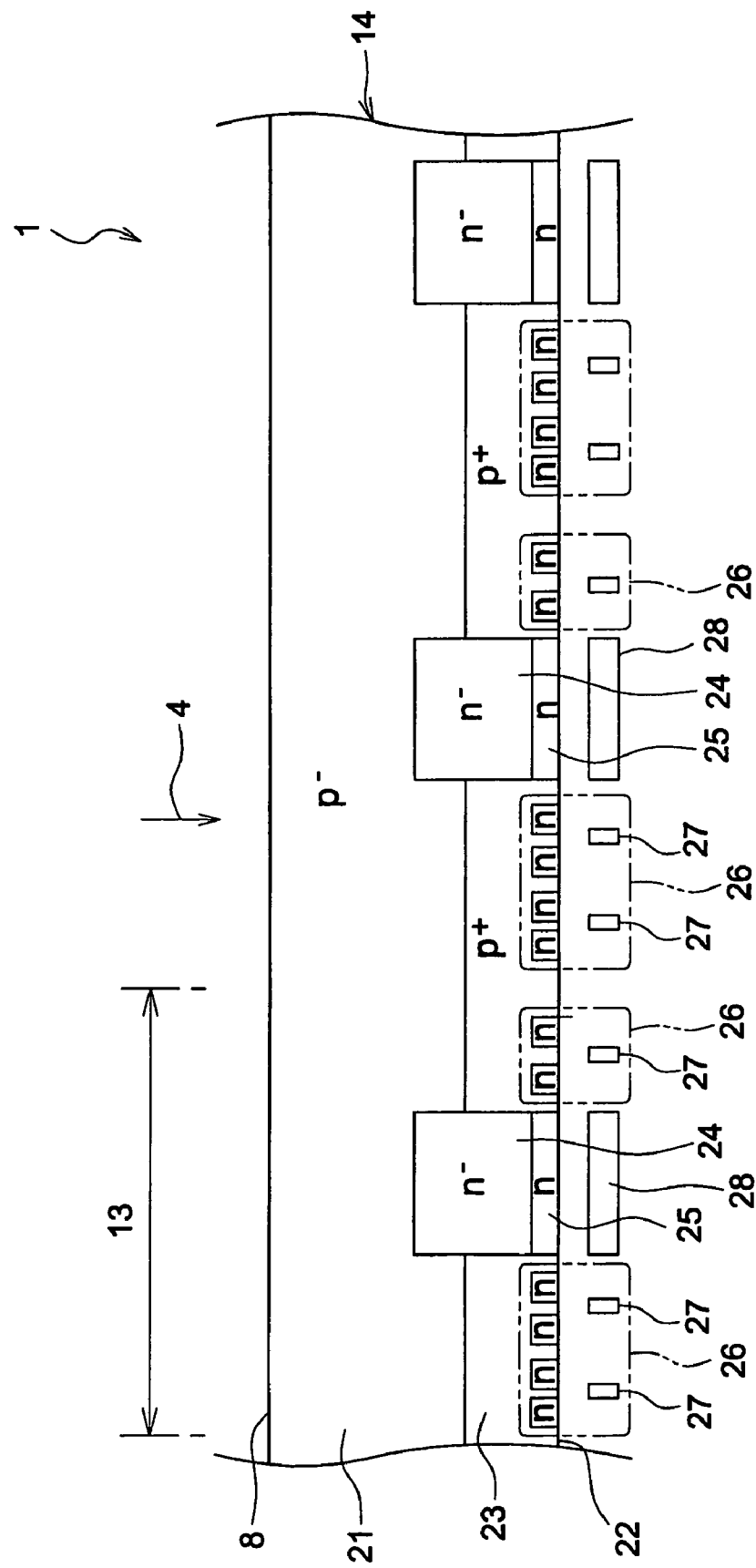
FIG. 8 is a cross-sectional view taken along a line III-III of FIG. 2, showing a back-illuminated image sensor according to a third embodiment of the present invention.
Figure 9:
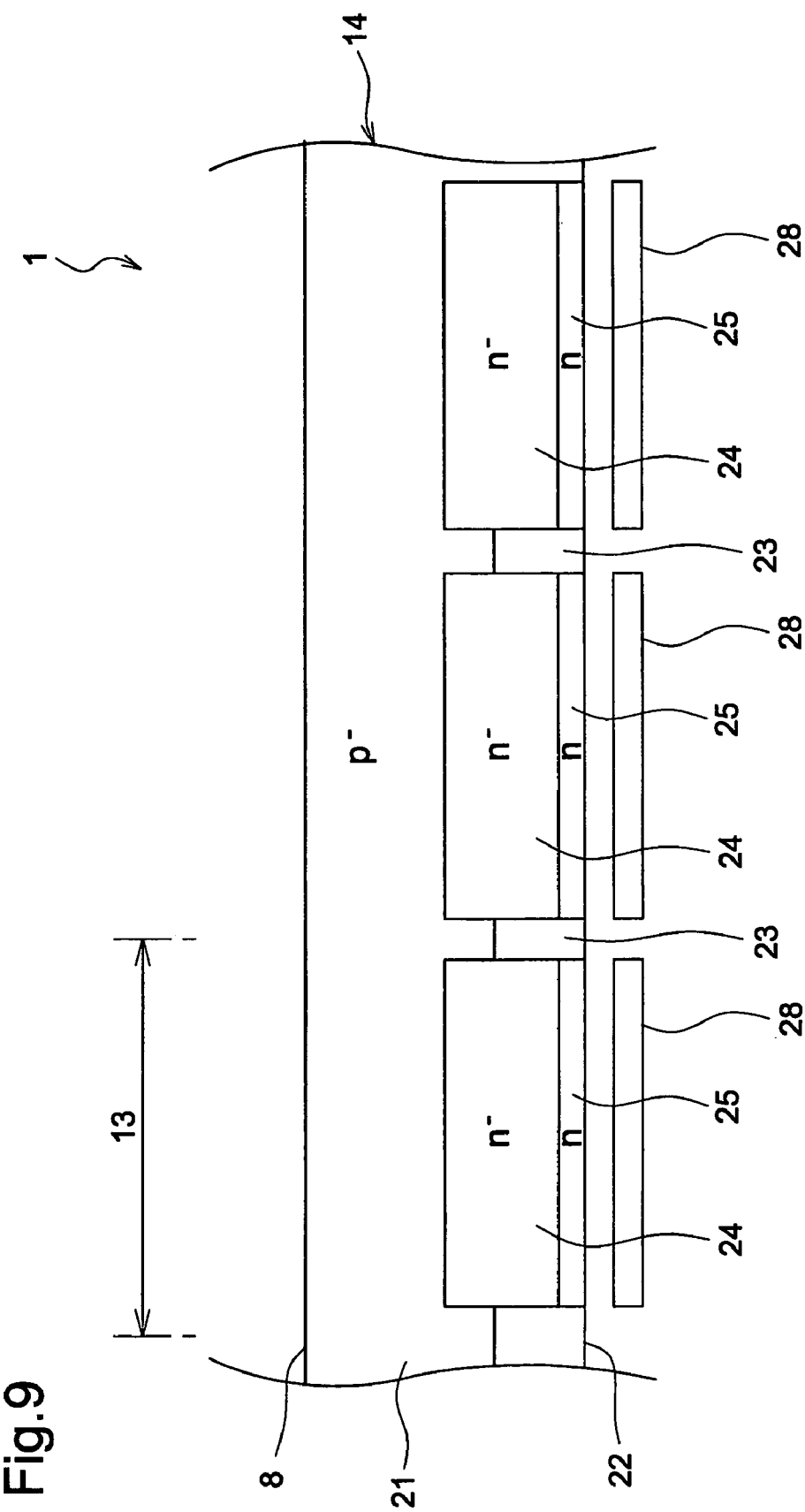
FIG. 9 is a cross-sectional view taken along a line IV-IV of FIG. 2, showing the back-illuminated image sensor according to the third embodiment of the present invention.

As shown in FIGS. 8 and 9, a back-illuminated image sensor 1 according to a third embodiment of the present invention is provided neither fluorescent film 9 nor fiberglass 10 (refer to FIGS. 3, 4, 6 and 7). The electron currents 4 having passed through the sample 5 directly enter the incident face 8. The electron currents 4 reach the converting layer 21, resulting in that secondary electrons that act as signal charges are generated. These signal charges gather in the charge collecting portion 24 and are transferred to the peripheral circuit 26 via the input region 25. Since a charge blocking layer 23 is disposed between the converting layer 21 and the peripheral circuit 26, the secondary electrons generated in the converting layer 21 are prevented from directly reaching the peripheral circuit 26.

Since such an electron current direct-entry type back-illuminated image sensor as in the third embodiment is directly exposed to a high-energy electron current, the service life of the sensor tends to become shorter. Thus, it is preferable that the electron currents should be irradiated on the incident face 8 after the intensity of the current is weakened by the setting of the magnetic lenses 6A to 6C (refer to FIG. 1) or the like.

Since the other configurations and operations of the third embodiment are similar to those of the first embodiment, the same elements are designated by the same numerals and their descriptions are omitted.

Fourth Embodiment

Figure 10:
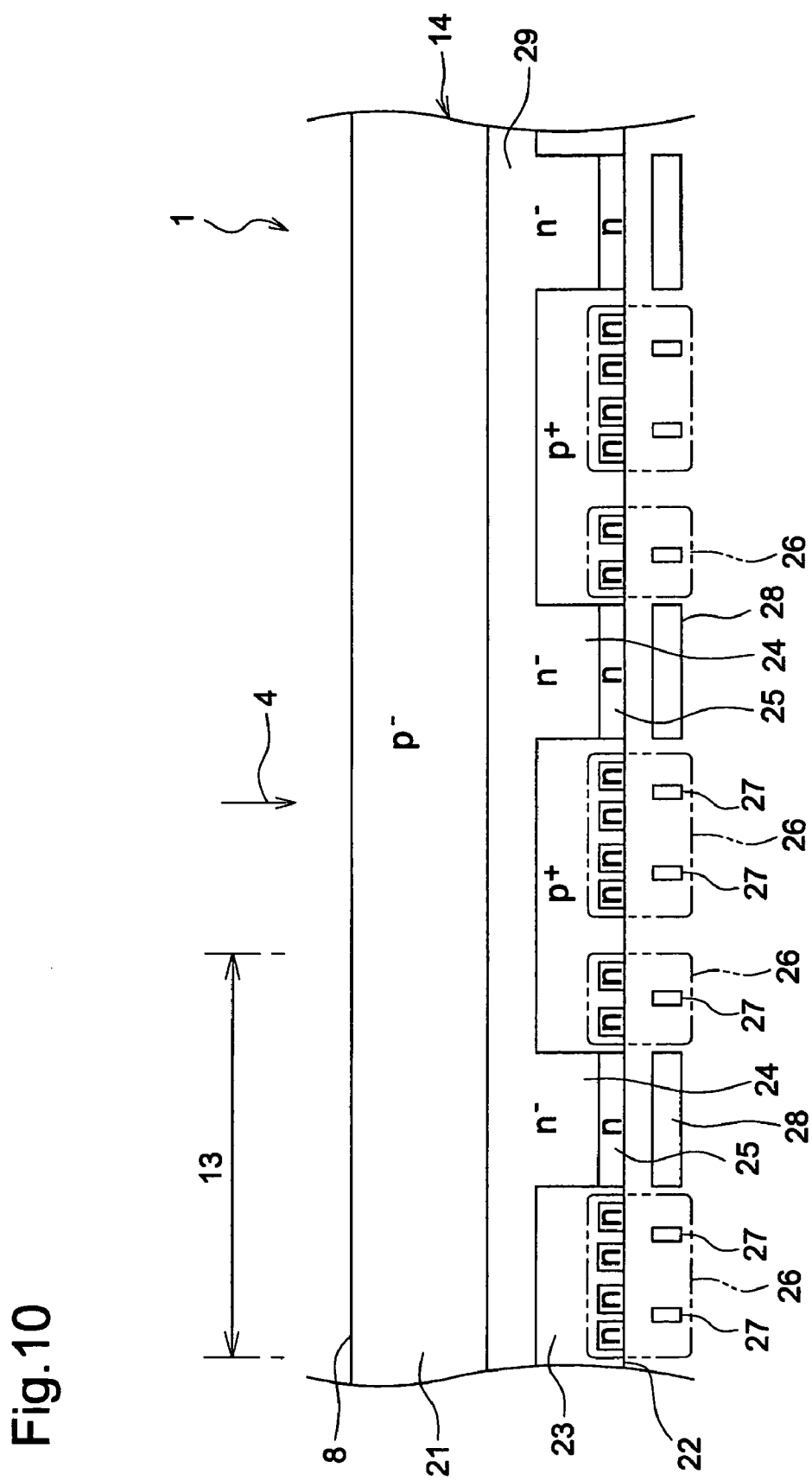
FIG. 10 is a cross-sectional view taken along a line III-III of FIG. 2, showing a back-illuminated image sensor according to a fourth embodiment of the present invention.
Figure 11:
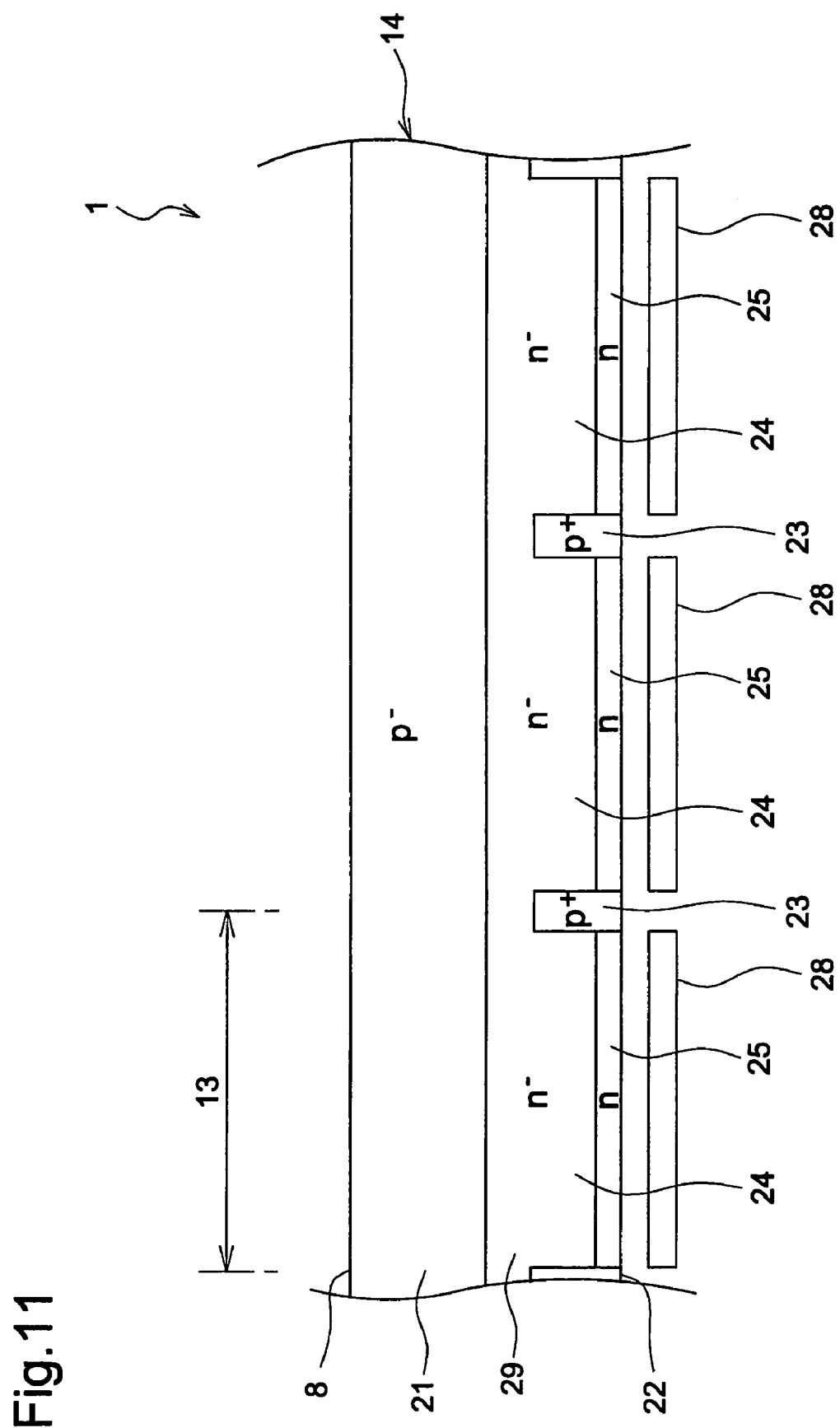
FIG. 11 is a cross-sectional view taken along a line IV-IV of FIG. 2, showing the back-illuminated image sensor according to the fourth embodiment of the present invention.

As shown in FIGS. 10 and 11, a back-illuminated image sensor 1 according to a fourth embodiment of the present invention is provided with the $n^-$-type charge collecting layer 29 arranged between the converting layer 21 and charge blocking layer 23 and connected to the charge collecting portions 24. The secondary electrons generated in the converting layer 21 are collected by the charge collecting layer 29 and accumulated in the charge collecting portions 24, whereby the mixture of the signal charges into the peripheral circuits 26 can be prevented more effectively.

Since the other configurations and operations of the fourth embodiment are similar to those of the third embodiment, the same elements are designated by the same numerals and their descriptions are omitted.

Fifth Embodiment

Figure 12:
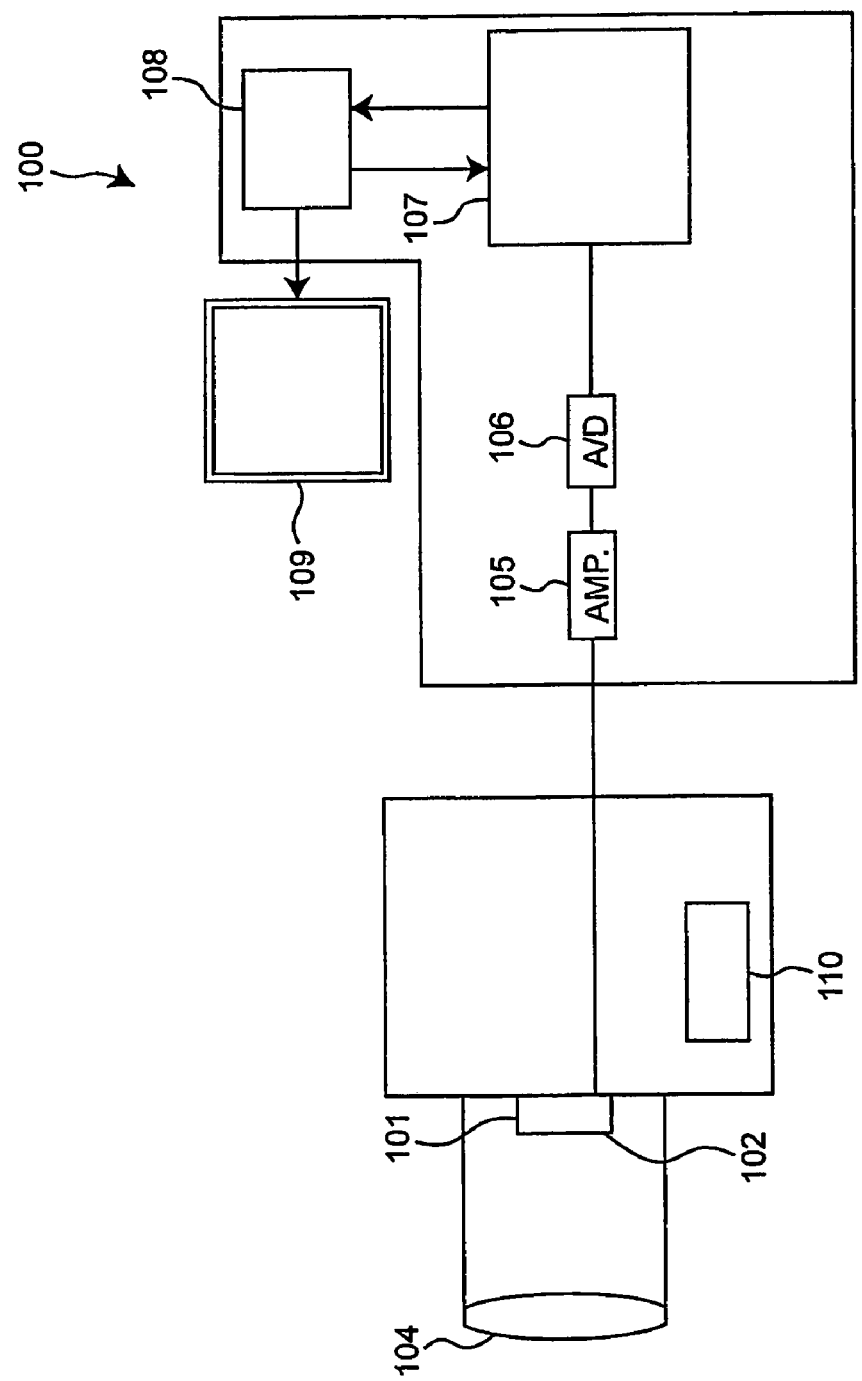
FIG. 12 is a schematic view showing a high-speed camera provided with a back-illuminated image sensor according to a fifth embodiment of the present invention.

A fifth embodiment of the present invention shown in FIGS. 12 to 17 is an embodiment wherein the present invention is applied to an in-situ storage image sensor (ISIS). With reference to FIG. 12, a high-speed video camera 100 provided with a back-illuminated image sensor 101 according to the fifth embodiment has a lens 104 for focusing visible lights 103 to form images on an incident face 102, an amplifier 105 for amplifying analog image signals output from the back-illuminated image sensor 101, an A/D converter 106 for converting the amplified image signals into digital signals, and a main memory 107 for storing the digital image signals. An image processing apparatus 108 processes the image signals read from the main memory 107 and displays images on a display apparatus 109. A controller 110 controls the operations of the whole video camera including the image sensor 101, amplifier 105, and A/D converter 106.

Figure 13:
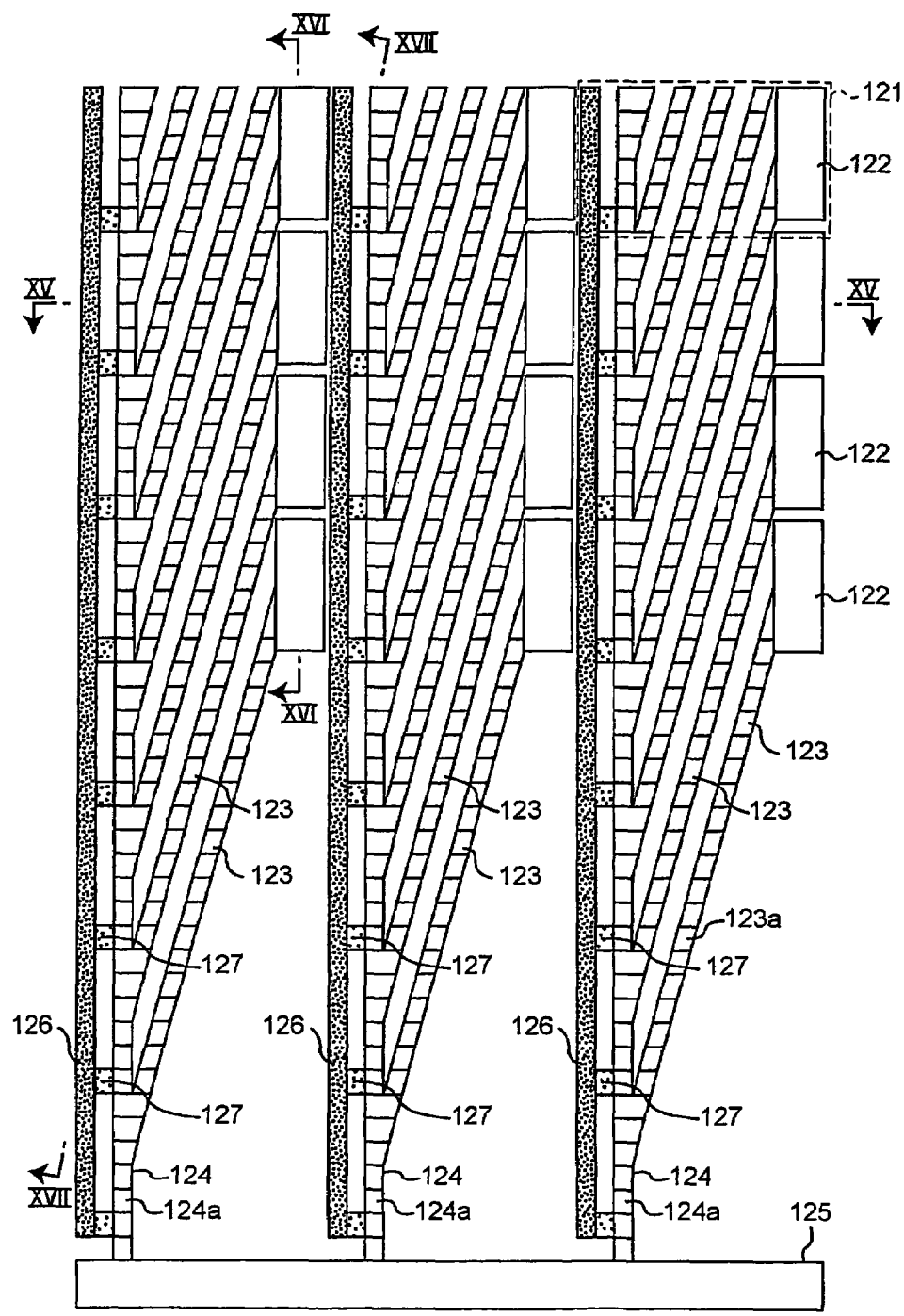
FIG. 13 is a schematic front view showing the back-illuminated image sensor according to the fifth embodiment of the present invention.
Figure 15:
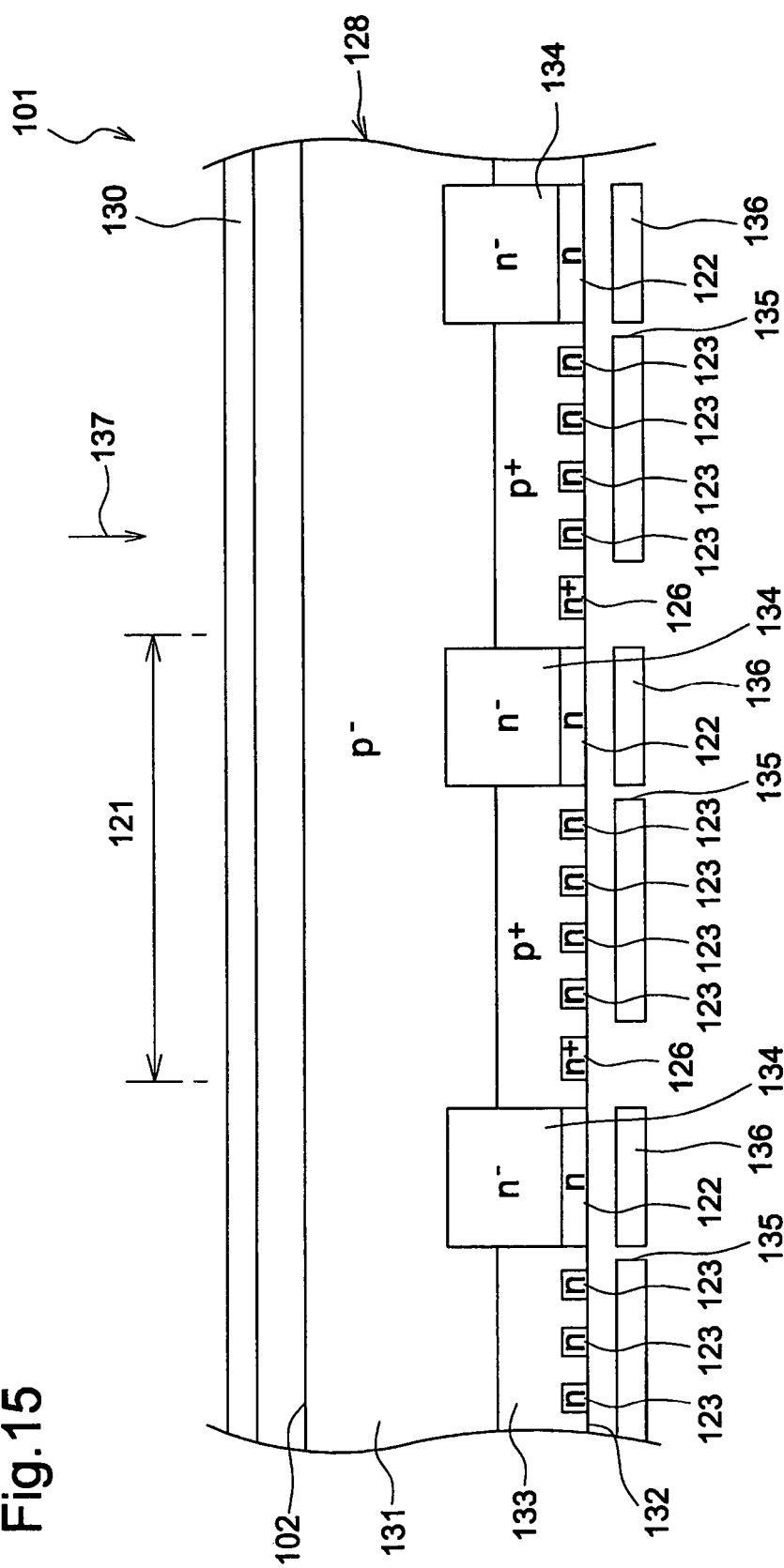
FIG. 15 is a cross-sectional view taken along a line XV-XV of FIG. 13.
Figure 16:
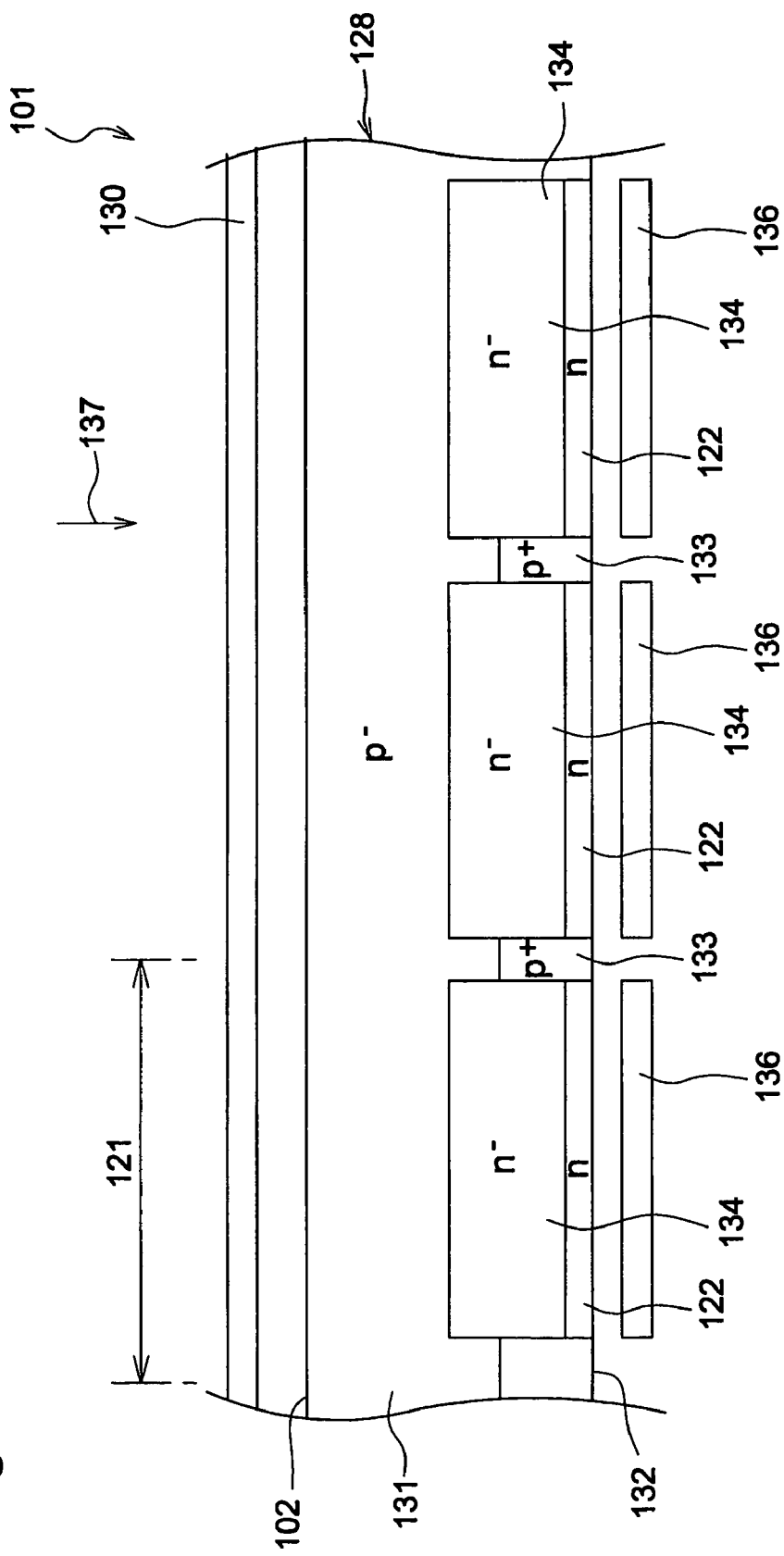
FIG. 16 is a cross-sectional view taken along a line XVI-XVI of FIG. 13.
Figure 17:
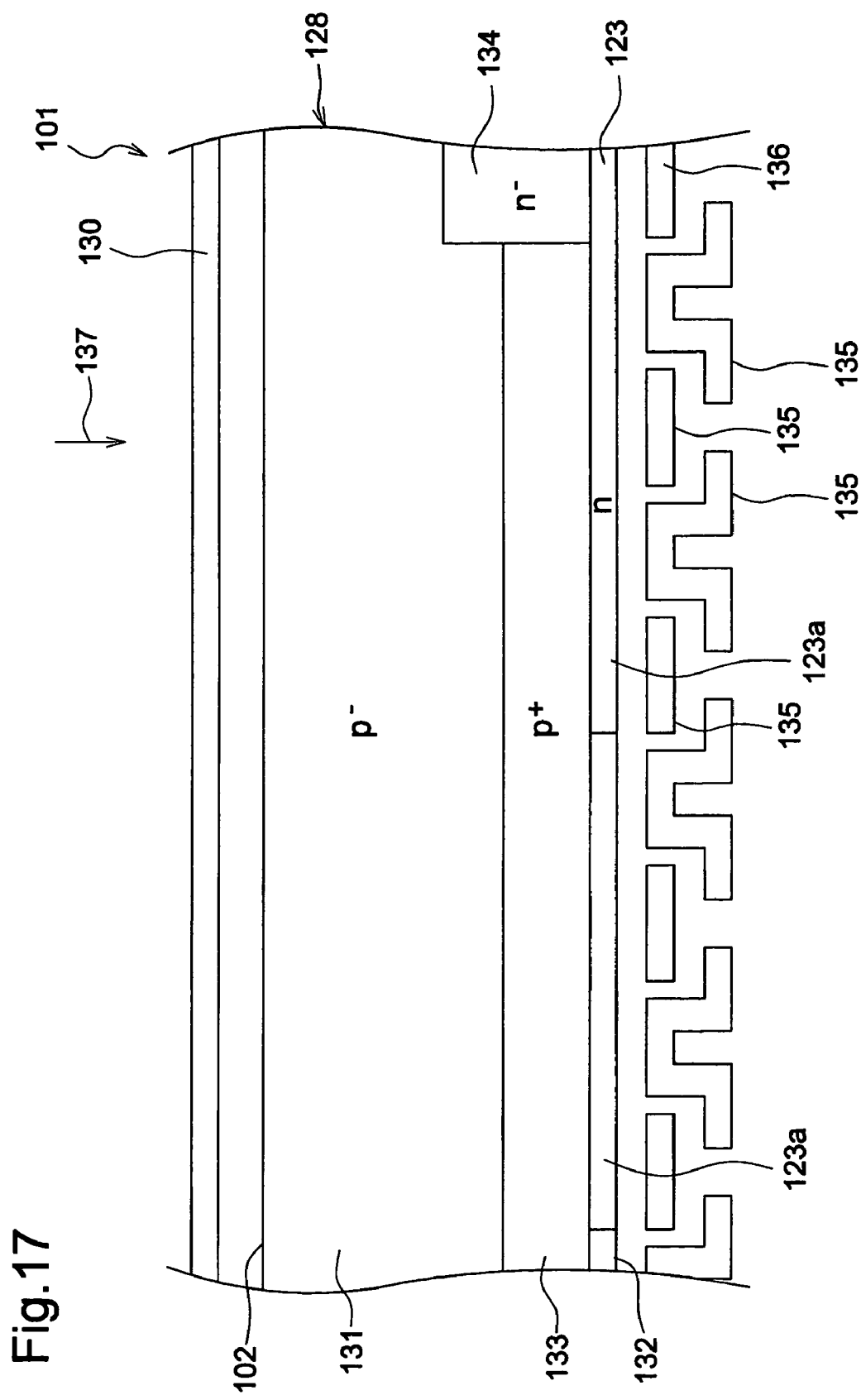
FIG. 17 is a cross-sectional view taken along a line XVII-XVII of FIG. 13.

FIG. 13 is a view showing the back-illuminated image sensor 101 seen from the incident face 102 (refer to FIGS. 15 to 17). Although only twelve (four rows×three columns) pixels 121 are shown in FIG. 13 for simplicity, each of the number of the rows and the number of the columns of the pixels can be not smaller than two. Further, an optical filter 130, a converting layer 131 and charge collecting portions 134 (refer to FIGS. 15 to 17) described later are not shown in FIG. 13.

With reference to FIG. 13, the structure of the back-illuminated ISIS will be described below. An input region 122 is provided for each of pixels 121. The input regions 122 and the pixels 121 including the input regions 122 are arranged so that the row and column directions thereof are orthogonal with each other. For each of input regions 122, a signal recording CCD 123 extending in the diagonally lower left direction in the figure is provided. Further, for each of the columns of the input regions 122, a CCD (a vertical reading CCD 124) extending in the vertical direction (in the column direction) in the figure is provided. Furthermore, a drain line 126 is provided so as to be adjacent to each of vertical reading CCDs 124. Still further, a CCD (a horizontal reading CCD 125) extending in the horizontal direction (in the row direction) in the figure is provided.

One end of each signal recording CCD 123 is connected to the corresponding input region 122 via an input gate (not shown), and the other end thereof is connected to the vertical reading CCD 124. In the signal recording CCDs 123, one ends thereof being connected respectively to the corresponding input regions 122 forming the same column, the other ends thereof merge into the same vertical reading CCD 124 corresponding to the column. In other words, all the signal recording CCDs 123 connected to the input regions 122 forming the same column merge into the same vertical reading CCD 124. Among the signal recording elements or elements 124a of the vertical reading CCD 124, the element 124a on the one-level upstream side of the element 124a into which the signal recording CCD 123 merges is connected to the drain line 126 via a drain gate 127. The respective lower ends of the vertical reading CCDs 124 in the figure are connected to the horizontal-reading CCD 125.

Figure 14:
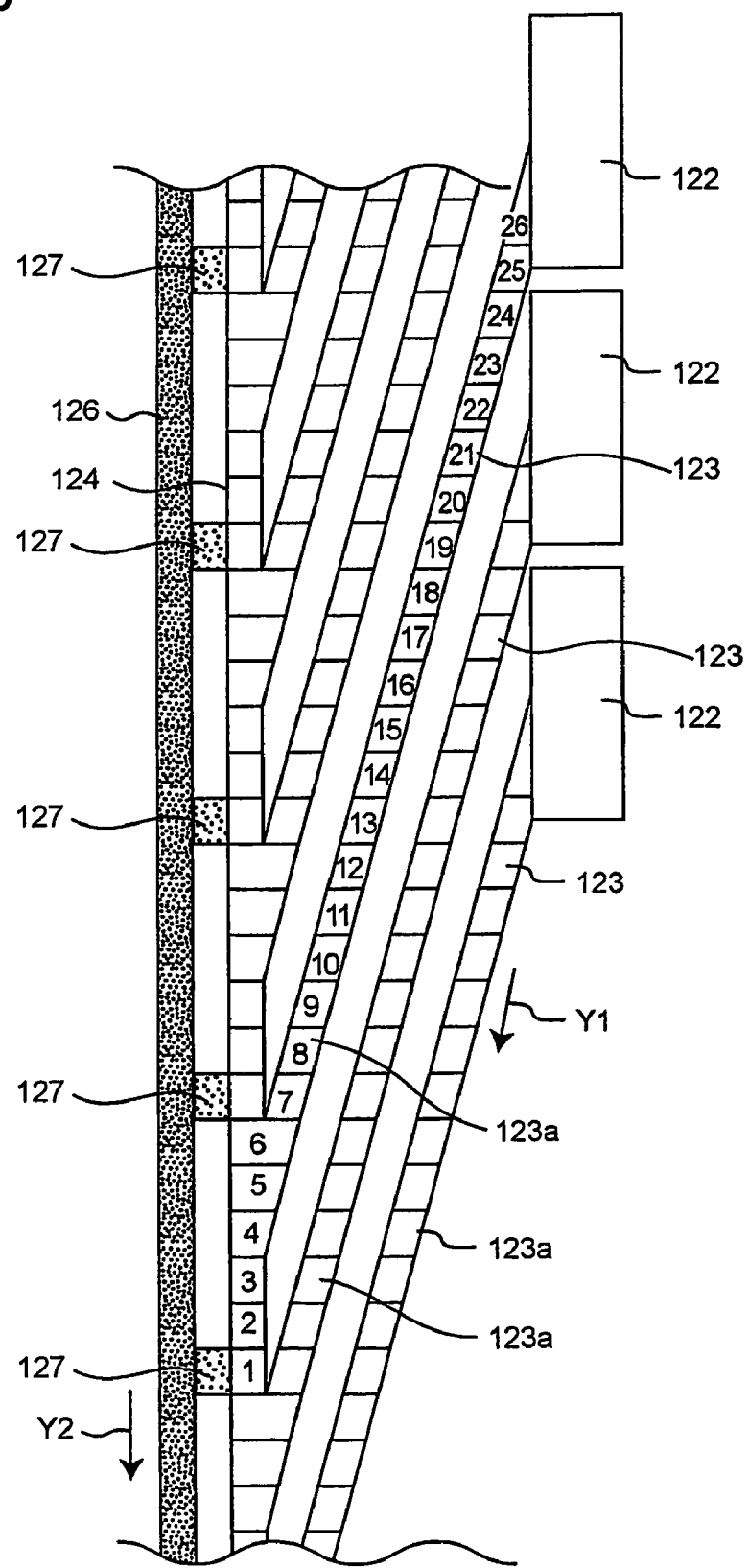
FIG. 14 is a partially enlarged view of FIG. 13.

In the back-illuminated image sensor 101 of the fifth embodiment, continuous overwriting is carried out during image capturing. With reference to FIG. 14, signal charges are sequentially transferred from the input region 122 to the elements 123a of the signal recording CCD 123 during the image capturing as indicated by an arrow Y1. When it is assumed that signal charges have been stored in the elements 123a numbered 1 to 26 at a certain moment, it is indicated that as the number assigned to an element 123a is smaller, the signal charge stored therein corresponds to an older image, and that as the number is larger, the signal charge corresponds to a newer image. At the next moment after the state shown in FIG. 14, a signal charge is discharged from the element 123a numbered 1 to the drain line 126 via the drain gate 127, and a signal charge corresponding to the newest 27th image is input from the input region 122 to the element 123a numbered 26. Furthermore, the signal charges corresponding to the second to the 26th images are transferred, one by one, to the elements 123a on the downstream side. Thus, the signal charges corresponding to the second to the 27th images are recorded in the signal recording CCD 123. This continuous overwriting continues during the image capturing.

When the occurrence of a phenomenon to be captured is detected, the continuous overwriting is stopped. The operation steps for reading the stored signal charges are generally as described below. (1) Charge transfer at the signal recording CCD 123s is stopped, whereas charge transfer is carried out only in the vertical reading CCD 124 as indicated by an arrow Y2 so that the signal charges are transferred to the horizontal reading CCD 125. The vertical reading CCD 124 is emptied by this operation step. (2) The charges are transfer from the signal recording CCDs 123 to the vertical reading CCD 124 so that the vertical reading CCD 124 is filled with charges.

Supposed to that the signal recording CCDs 123 do not extend in the diagonally lower direction in FIG. 13, the signal recording CCD 123 connected to one input region 122 interferes with the next input region 122 disposed one-level lower than the input region 122, whereby the signal recording CCD 123 cannot be extended sufficiently. For the purpose of sufficiently extending the signal recording CCD 123, the input region 122 to be disposed at a lower level should only be slightly shifted more to the right so that the signal recording CCD 123 can be extended directly downward. In this arrangement, centers of the input regions 122 forming pixel axes do not form a square lattice or a rectangular lattice but form a rhombus lattice. For the purpose of eliminating such rhombus lattice, the position of the input region 122 should only be slightly shifted upward. The layout obtained as a result of this shifting is slightly rotated clockwise, resulting in that the layout shown in FIG. 13. This is the reason why the signal recording CCDs 123 are placed obliquely with respect to the pixel axes.

In FIGS. 13 and 14, for simplicity, it is assumed that the signal charges corresponding to 26 images are stored in the signal recording CCDs 123 and the vertical reading CCDs 124. However, the number of images capable of being captured continuously can be increased by increasing the numbers of these elements 123a and 124a. For example, by providing 103 elements in the vicinity of each pixel, images captured at a capturing speed of 1,000,000 frames per second can be reproduced as a moving image of 10 seconds at a reproduction speed of 10 frames per second.

With reference to FIGS. 15 to 17, an optical filter 130 is disposed on an incident face 102 of a chip 128. Further, a $p^-$-type converting layer 131 is provided on the incident face 102 side of the chip 128, and a $p^+$-type charge blocking layer 133 is provided on a surface 132 side of the converting layer 131.

An $n^-$-type charge collecting portion 134 for collecting the signal charges generated in the converting layer 131 is provided for each of pixels 121. One end of the charge collecting portion 134 is positioned inside the converting layer 131, and the charge collecting portion 134 extends from the converting layer 131 to the surface 132 side of the chip 128. An n-type input region 122 is provided at the other end of each of the charge collecting portions 134. The other end of each of the charge collecting portions 134 is positioned on the surface 132 side of the chip 128. The charge collecting portion 134 extends passing through the charge blocking layer 133, and the input region 122 is embedded in the charge blocking layer 133.

The signal recording CCDs 123 are provided in the region on the surface 132 side of the charge blocking layer 133. The signal recording CCDs 123 are embedded in the charge blocking layer 133. In FIGS. 15 to 17, a reference numeral 135 denotes an electrode for driving the signal recording CCD 123, and a reference numeral 136 denotes an electrode for transferring signal charges from the input region 122 to the signal recording CCD 123. Since the signal recording CCD 123 is a four-phase drive type in this embodiment, four electrodes 135 are provided for each of elements 123a as shown in FIG. 17.

For example, the converting layer 131, charge blocking layer 133, charge collecting portion 134, and input region 122 of the back-illuminated image sensor 101 are made of semiconductor materials mainly consisting of $p^-$-type silicon having an impurity concentration of $1\times10^{10}$ to $1\times10^{15}$ cm$^{-3}$, $p^+$-type silicon having an impurity concentration of $1\times10^{15}$ to $1\times10^{16}$ cm$^{-3}$, n-type silicon having an impurity concentration of $1\times10^{13}$ to $1\times10^{16}$ cm$^{-3}$ and $n^+$-type silicon having an impurity concentration of $1\times10^{16}$ to $1\times10^{20}$ cm$^{-3}$ respectively. In this case, these can be produced by implanting boron and phosphorus ions on a $p^-$-type substrate using a photoresist as a mask and subsequent thermal diffusion.

The light 137 having entered the incident face 102 via the optical filter 130 reaches the converting layer 131, resulting in that electron-hole pairs are generated. Since the electrons have a negative charge, they gather at the $n^-$-type charge collecting portion 134 and further-accumulate at the n-type input region 122. The holes pass through the $p^-$-type converting layer 131 and are discharged continuously to the outside of the chip. The electrons, i.e., signal charges, accumulating in each of the input regions 122 are output to the corresponding signal recording CCD 123.

The $p^-$-type converting layer 131 and the n-type signal recording CCD 123 are separated from each other by the $p^+$-type charge blocking layer 133. Thus, it is possible to prevent the phenomenon wherein the electrons generated in the converting layer 131 directly reach the signal recording CCDs 123 by diffusion or diffraction without passing through the charge collecting portions 134 and the input regions 122. For this reason, noise generation or the like in the signal recording CCD 123 due to the mixture of signal charges can be prevented. The charge blocking layer 133 also functions as a channel stop for electrically separating the adjacent signal recording CCDs 123 from each other.

Then, the optical filter 130 will be described below. Table 1 shows the relationship between the thickness of the chip and the transmittance thereof with regard to silicon monocrystal wafers used for the production of ordinary CCD-type image sensors. The relationship is obtained by calculation using wavelength and absorption coefficient of incident light. In the thinnest case, chips having a thickness of approximately 20 μm are used for back-illuminated image sensors.

TABLE 1

| Wavelength (nm) | Absorption coefficient | Transmittance (20 μm) | Transmittance (30 μm) |
|---|---|---|---|
| 400 | 5.337 | $4.39954 \times 10^{-47}$ | $2.92 \times 10^{-70}$ |
| 450 | 2 | $4.24835 \times 10^{-18}$ | $8.76 \times 10^{-27}$ |
| 500 | 1.11 | $2.28382 \times 10^{-10}$ | $3.45 \times 10^{-15}$ |
| 550 | $6.93 \times 10^{-1}$ | $9.50764 \times 10^{-7}$ | $9.27 \times 10^{-10}$ |
| 600 | $4.81 \times 10^{-1}$ | $6.69208 \times 10^{-5}$ | $5.47 \times 10^{-7}$ |
| 650 | $3.16 \times 10^{-1}$ | 0.001792758 | $7.59 \times 10^{-5}$ |
| 700 | $2.19 \times 10^{-1}$ | 0.012475357 | 0.001393 |
| 750 | $1.52 \times 10^{-1}$ | 0.047834889 | 0.010462 |
| 800 | $9.42 \times 10^{-2}$ | 0.149868056 | 0.058018 |
| 850 | $6.24 \times 10^{-2}$ | 0.286848809 | 0.153631 |

In a back-illuminated in-situ storage image sensor, light transmittance is preferably not more than 1/10000. For example, in the case that signal charges corresponding to 100 images can be stored in the signal recording CCDs 123 and the vertical reading CCDs 124 as described above, one image is captured, the signal charges of the captured image are stored until 99 images are captured at maximum. If the light reaches the signal recording CCDs 123 and the vertical reading CCDs 124, charges are generated. Supposed to that the ratio of the light having entered the incident face 102 passes through the signal recording CCD 123 on the surface 132 side (transmittance) is 1/10000, signal charges amounting to 1/10000 of regular signal charges are added to the regular signal charges each time one image is captured. Thus, while 100 images are captured, unnecessary signal charges amounting to 1/10000×100 (images)=1/100, that is, 1%, are applied to the regular signal charges. If the ratio exceeds several percents, a very displeasing phenomenon referred to as smear occurs.

According to Table 1, the transmittance of light having a wavelength of 600 nm and passing through a silicon monocrystal having a thickness of 20 μm is 6.692×10$^{-5}$, and the transmittance of light having a wavelength of 650 nm and passing through a silicon monocrystal having a thickness of 30 μm is $7.59 \times 10^{-5}$. Thus, these cases satisfy the above-mentioned condition where the transmittance should not more than $\frac{1}{10000}$. On the other hand, the transmittance of light having a wavelength of 650 nm and passing through the silicon monocrystal having a thickness of 20 μm is 0.00179, and the transmittance of light having a wavelength of 700 nm and passing through the silicon monocrystal having a thickness of 30 μm is 0.001393. These cases do not satisfy the above-mentioned condition where the transmittance should not be more than $\frac{1}{10000}$. For example, considering a case where the light having a wavelength of 700 nm enters the silicon monocrystal having a thickness of 30 μm, a value of 0.1393 is obtained by multiplying the transmittance, i.e., 0.001393 by 100. Thus, while 100 images are captured, unnecessary charges amounting to 13.93% are added to the signal charges.

According to the above discussion, it is preferable that, in the case that the thickness of the chip is 30 μm, the optical filter 130 substantially shuts off light having wavelengths of 700 to 1000 nm, more specifically, that the transmittance of light having these wavelengths is not more than 1%. However, in the case that the number of images to be captured continuously is less than 100, the transmittance of light having these wavelengths can be equal to or more than 1%. In the opposite case, that is, when the number of images to be captured continuously is more than 100, the transmittance of light need to be less than 1%. Furthermore, a certain time period is necessary after the stop of continuous image capturing and until a shutter (not shown) is closed and light entering the back-illuminated image sensor 101 from an optical system becomes extinct. During this time period, a large amount of light enters. More specifically, in the case that the image capturing speed is 1,000,000 frames per second, an amount of light approximately $10^4$ times the amount of the incident light at the time of image capturing enters the incident face 102 during this time period. It is thus necessary to set the transmittance of the light passing through the optical filter 130 considering this time period after the stop of continuous image capturing and until the stop of light incident on the incident face 102.

Since the optical filter 130 in which light transmittance is set properly is provided, it is possible to prevent the phenomenon wherein the light directly reaches the signal recording CCDs 123, unnecessary charges are generated, and deterioration in image quality is caused.

Sixth Embodiment

Figure 18:
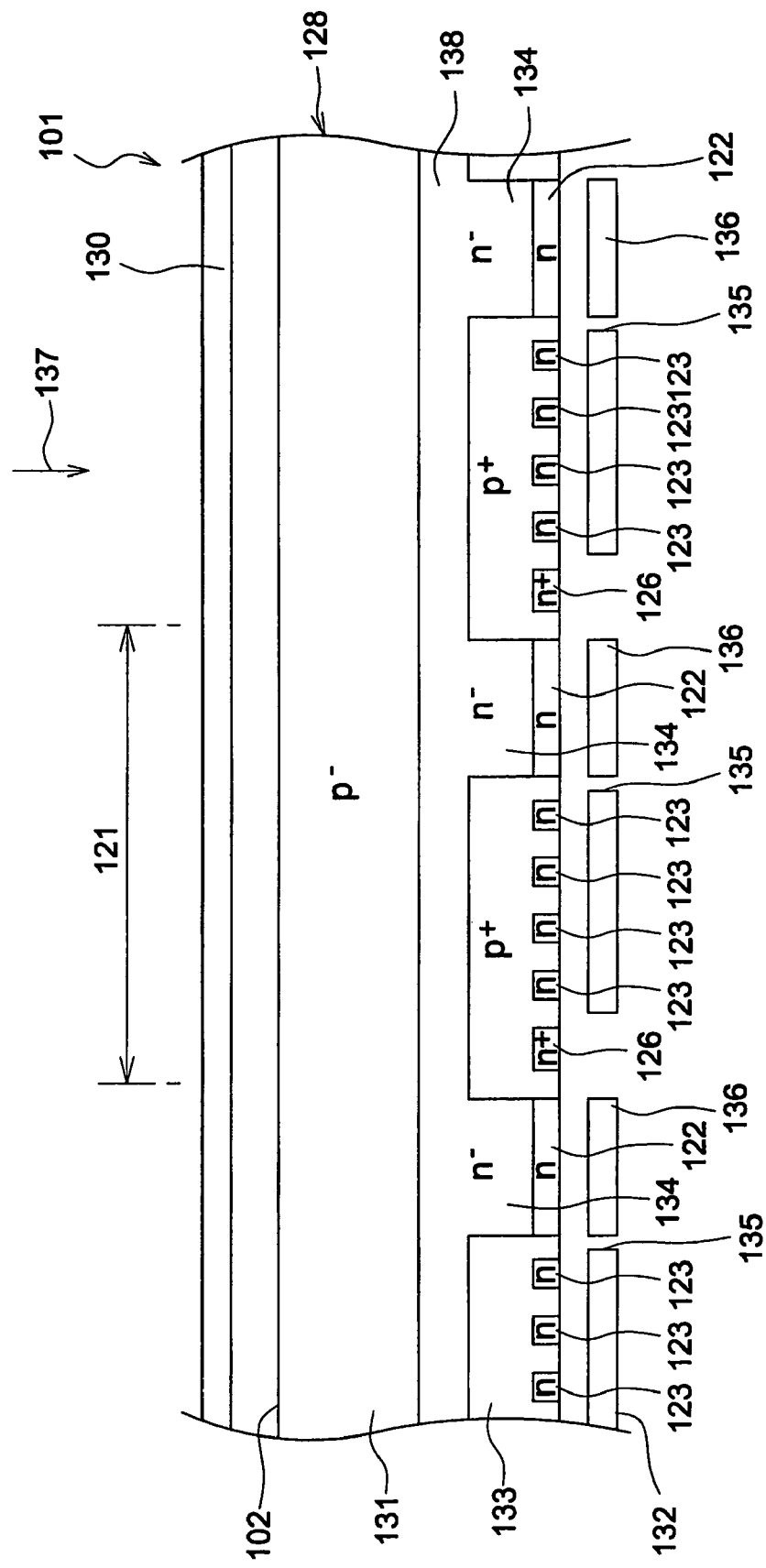
FIG. 18 is a cross-sectional view taken along a line XV-XV of FIG. 13, showing a back-illuminated image sensor according to a sixth embodiment of the present invention.
Figure 19:
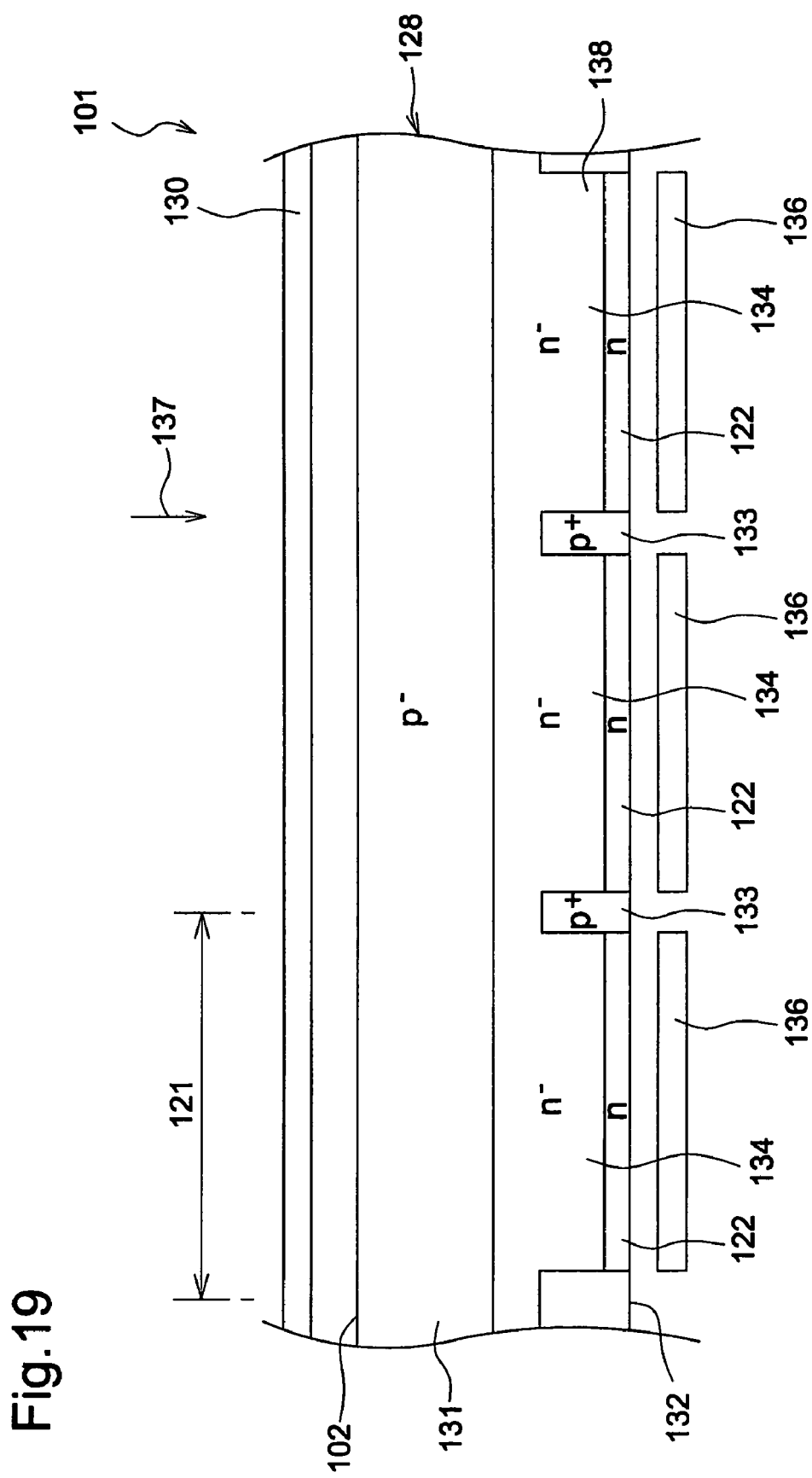
FIG. 19 is a cross-sectional view taken along a line XVI-XVI of FIG. 13, showing the back-illuminated image sensor according to the sixth embodiment of the present invention.
Figure 20:
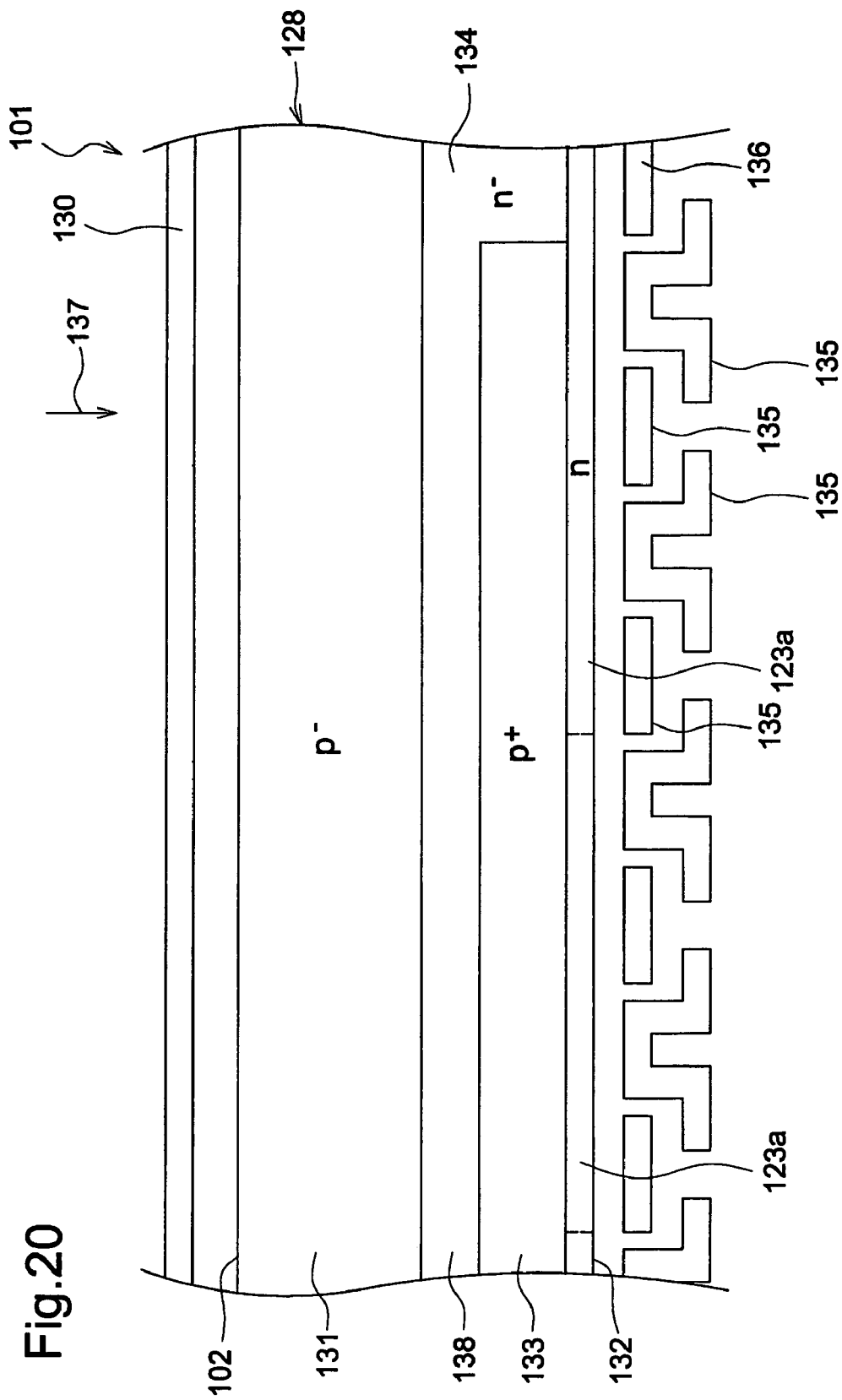
FIG. 20 is a cross-sectional view taken along a line XVII-XVII of FIG. 13, showing the back-illuminated image sensor according to the sixth embodiment of the present invention.

As shown in FIGS. 18 to 20, a back-illuminated image sensor 101 according to a sixth embodiment of the present invention is provided with an n⁻-type charge collecting layer 138. The charge collecting layer 138 is arranged between a converting layer 131 and a charge blocking layer 133 and is connected to end portions at the incident face 102 side of the charge collecting portions 134. The charges generated in the converting layer 131 gather once in the charge collecting layer 138. The charges having gathered in the charge collecting layer 138 move in the horizontal direction and are collected in the charge collecting portions 134. Thus, the mixture of the signal charges into the signal recording CCDs 123 can be prevented more effectively by the charge collecting layer 138.

For example, the back-illuminated image sensor 101 according to the sixth embodiment is produced as follows. An n⁻-layer having a thickness of approximately 2 to 8 μm is formed by implanting high-energy ions or by thermal diffusion to the surface side of a p⁻-type substrate. Then, a p⁺-layer is formed at approximately 2 to 8 μm from the surface in a similar way. Subsequently, peripheral circuits are formed on the surface side of the substrate by ion implantation.

Since the other configurations and operations of the sixth embodiment are similar to those of the fifth embodiment, the same elements are designated by the same numerals and their descriptions are omitted.

The present invention is not limited to the above-mentioned embodiments, but can be modified variously. For example, the incident beam may be electromagnetic rays other than light rays, the flow of charged particles other than electron rays such as ions and holes, and radioactive rays including α-rays, γ-rays, β-rays and neutron rays in addition to X-rays. In the case that the incident beam is the radioactive rays, a scintillator should is disposed on the incident face side of an image sensor, and the light generated by the scintillator depending on the intensity of the radioactive rays enters the image sensor. In this case, it is preferable that a substance generating green or blue light, that is, light having a relatively short wavelength, should be selected as the material of the scintillator in view of the service life of the image sensor. In the case that color image capturing is required, it is necessary to make the chip thicker so that red light does not reach the recording CCDs and the vertical reading CCDs. Furthermore, in the case of image analysis with high resolution, image capturing is executed by using light ranging from green to yellow light having the highest energy in natural light, and by shutting off light ranging from red to near-infrared light.

Although the present invention has been fully described in conjunction with preferred embodiments thereof with reference to the accompanying drawings, various changes and modifications are possible for those skilled in the art. Therefore, such changes and modifications should be construed as included in the present invention unless they depart from the intention and scope of the invention.

The invention claimed is:

1. A back-illuminated image sensor, comprising:
   a converting portion for converting an incident beam into signal charges, the converting portion being provided on an incident face side on which the incident beam is irradiated, and the converting portion being provided for each of a plurality of pixels arranged in two dimensions;
   a charge collecting portion for collecting the signal charges generated in the converting portion, the charge collecting portion extending from the converting portion to a surface side opposite to the incident face side;
   a charge processing portion for processing the signal charges collected by the charge correcting portions, the charge processing portion being provided on the surface side; and
   a suppressing region for suppressing a flow of the signal charges from the converting portion into the charge processing portion, the suppressing region being arranged between the converting portion and the charge processing portion.

2. A back-illuminated image sensor according to claim 1, wherein the converting portion, charge collecting portion, charge processing portion, and suppressing region are made of semiconductor materials,
   wherein the converting portion has a first conductivity type,
   wherein the charge collecting portion has a second conductivity type, and wherein the suppressing region comprises a charge blocking layer having the first conductivity type, the charge processing portion being embedded in the charge blocking layer, and the charge collecting portion penetrating through the charge blocking layer.

3. A back-illuminated image sensor according to claim 2, wherein the suppressing region further comprises a charge collecting layer having the second conductivity type, disposed between the converting portion and the charge blocking layer, and connected to an end portion at the incident face side of the charge collecting portion.

4. A back-illuminated image sensor according to claim 3, wherein the charge processing portion is an A/D converter for converting analog signals into digital signals.

5. A back-illuminated image sensor according to claim 3, wherein the charge processing portion is a signal charge storage portion for storing the signal charges provided inside or in the vicinity of each pixel.

6. A back-illuminated image sensor according to claim 1, wherein the incident beam is a light beam, and
wherein the image sensor further comprising an optical filter for blocking light having such wavelengths as that the light is transmitted from the incident side into the charge processing portion to cause generation of charges similar to the signal charges in the charge processing portion.

7. An electron microscope provide with the back-illuminated image sensor according to claim 1.

8. An image capturing apparatus provided with the back-illuminated image sensor according to claim 1.

* * * * *